(12) United States Patent
Druck

(10) Patent No.: US 7,467,172 B2
(45) Date of Patent: Dec. 16, 2008

(54) N DIMENSIONAL NON-LINEAR, STATIC, ADAPTIVE, DIGITAL FILTER DESIGN USING D SCALE NON-UNIFORM SAMPLING

(75) Inventor: Philip Druck, 481 Cape May St., Englewood, NJ (US) 07631

(73) Assignee: Philip Druck, Cape May, NJ (US)

( * ) Notice: Subject to any disclaimer, the term of this patent is extended or adjusted under 35 U.S.C. 154(b) by 731 days.

(21) Appl. No.: 10/250,830

(22) PCT Filed: Jan. 4, 2002

(86) PCT No.: PCT/US02/00940

§ 371 (c)(1),
(2), (4) Date: Jan. 30, 2004

(87) PCT Pub. No.: WO02/067422

PCT Pub. Date: Aug. 29, 2002

(65) Prior Publication Data

US 2004/0139135 A1    Jul. 15, 2004

(51) Int. Cl.
*G06F 17/17* (2006.01)

(52) U.S. Cl. ........................................ 708/313
(58) Field of Classification Search ................ 708/313, 708/319
See application file for complete search history.

(56) References Cited

U.S. PATENT DOCUMENTS

| | | | | |
|---|---|---|---|---|
| 5,497,152 A | * | 3/1996 | Wilson et al. | 341/61 |
| 5,717,617 A | * | 2/1998 | Chester | 708/313 |
| 6,236,283 B1 | * | 5/2001 | Koslov | 332/103 |
| 6,392,579 B1 | * | 5/2002 | Rezvani et al. | 341/152 |

* cited by examiner

*Primary Examiner*—Chuong D Ngo
(74) *Attorney, Agent, or Firm*—Gottlieb, Rackman & Reisman P.C.

(57) ABSTRACT

The present invention is a filter design that extracts information from a signal by employing D scale nonuniform sampling. In one embodiment a D scale multiresolution sampler, filter bank router, filter bank sampler controller, phase shifter, and consolidator constitute a maximal arrangement for a D scale FIR/IIR filter design.

18 Claims, 30 Drawing Sheets

Maximal Arrangement of D FIR/IIR Filter Design Components

Figure 1: Industry Standard Linear Systems Model (Time Domain)
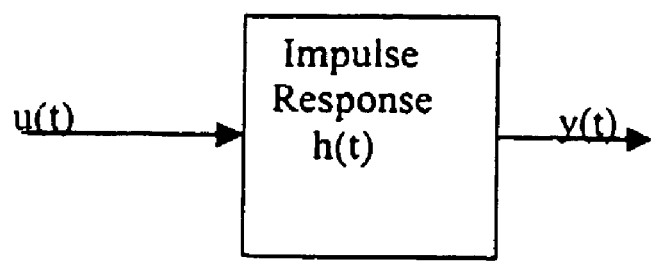

Figure 2: Transversal FIR Digital Filter
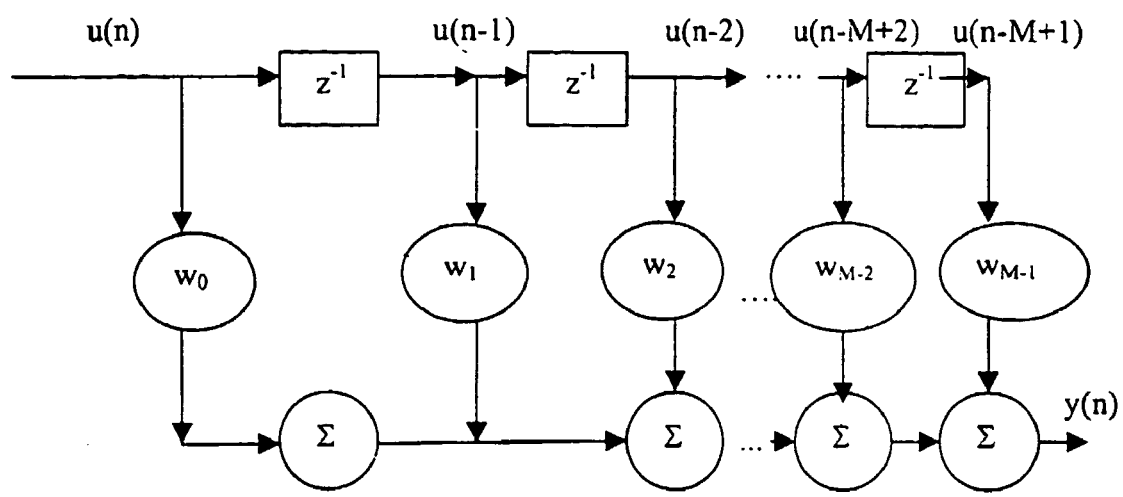

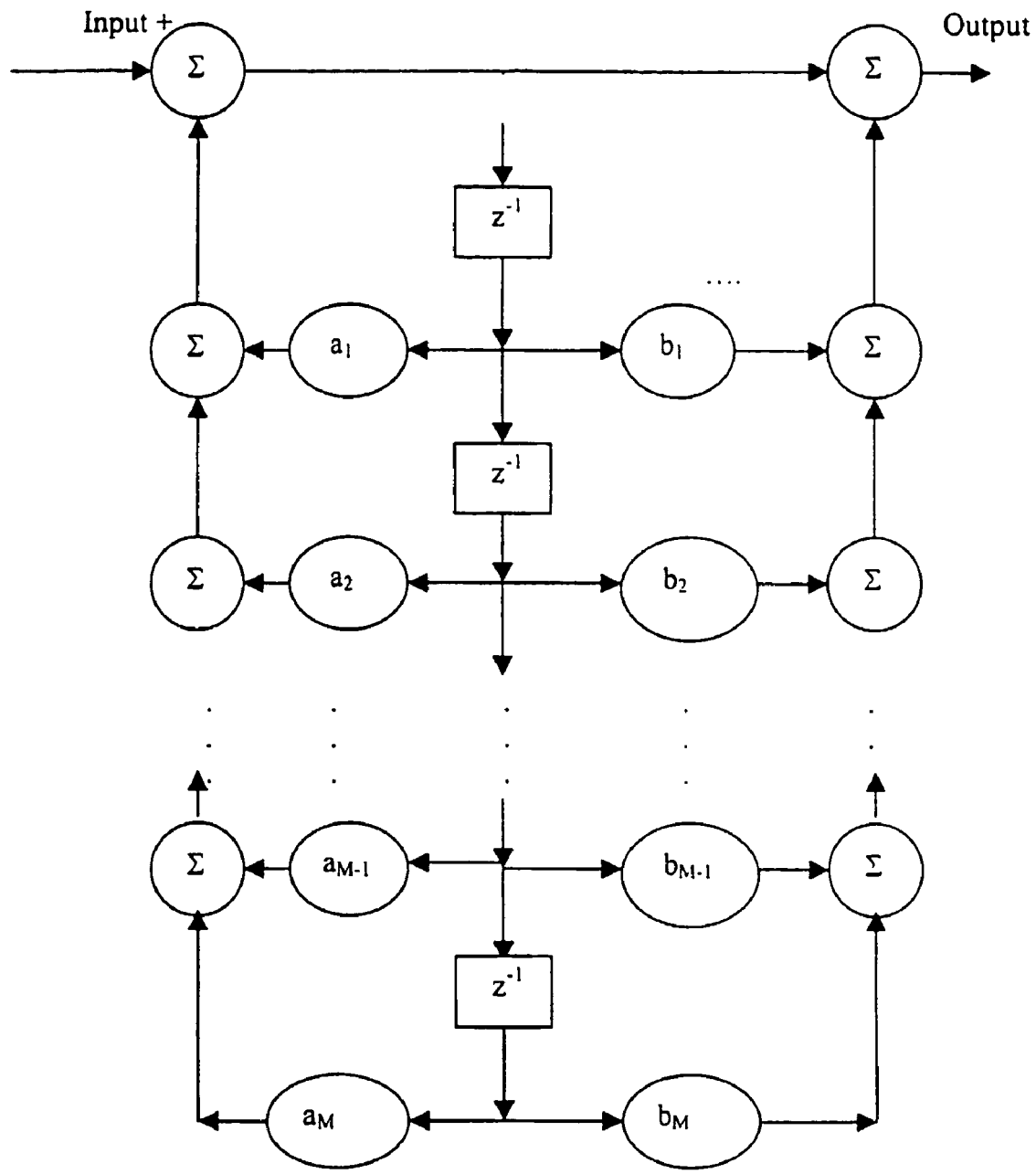
Figure 3: Transversal IIR Digital Filter

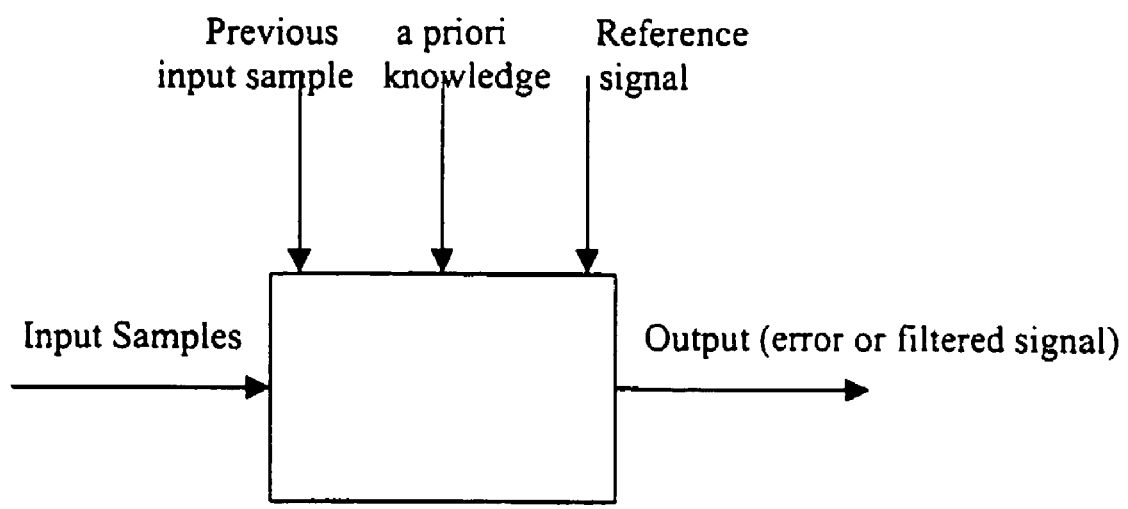
Figure 4: General Information Flow Through a Digital Filter

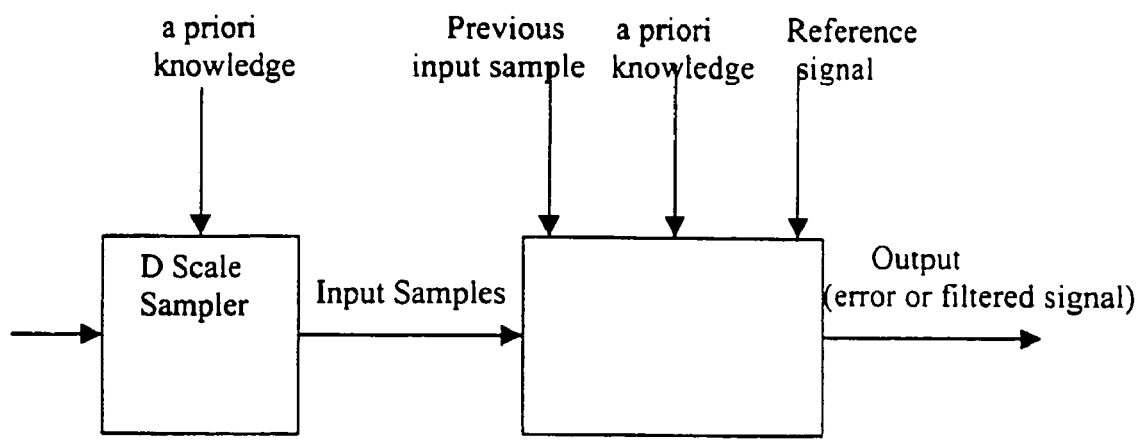
Figure 5: General Information Flow Through a Digital Filter Incorporating D Scale Sampler Figure 6: Maximal Arrangement of D FIR/IIR Filter Design Components
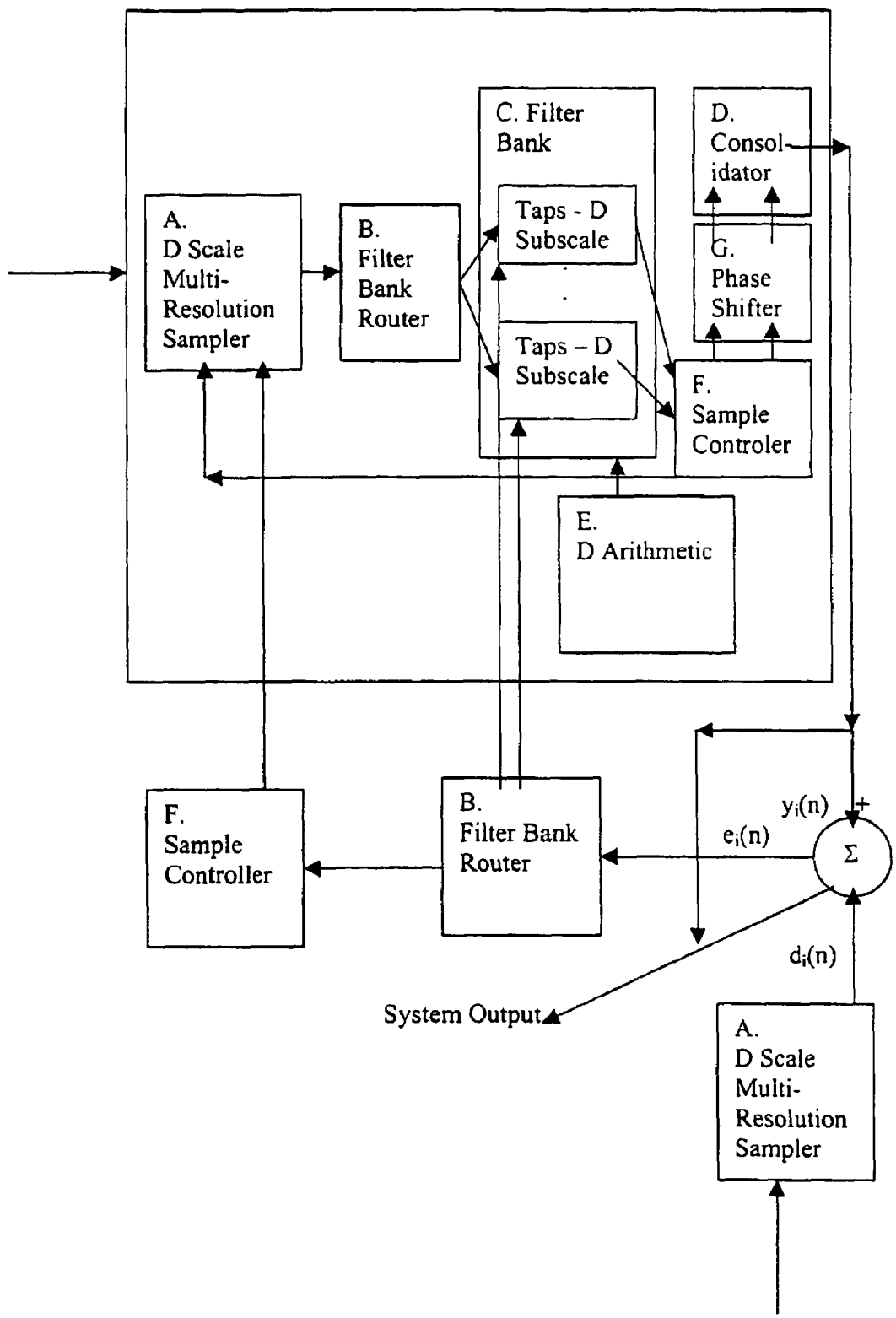

Figure 7. Static D Filter Design
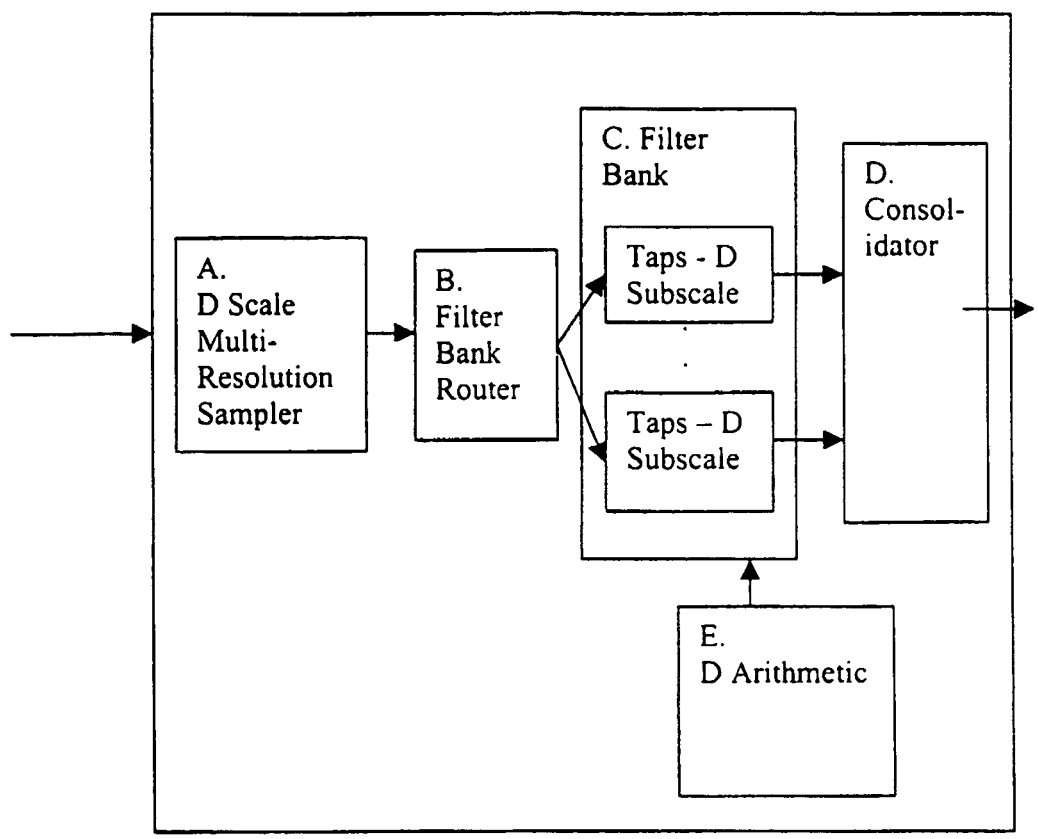

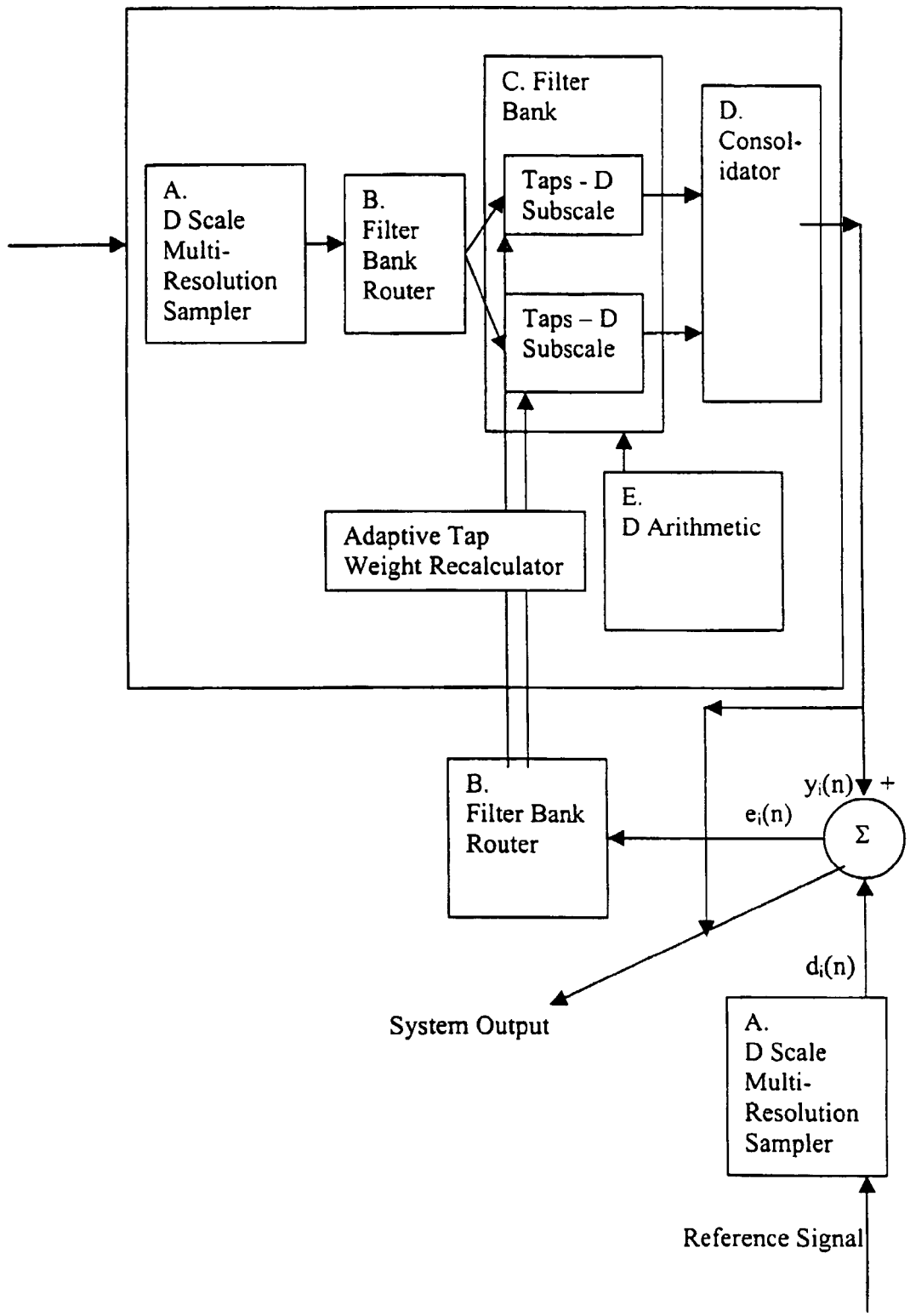
Figure 8. Adaptive D Filter Design

Figure 9: D Filter with Sample Controller
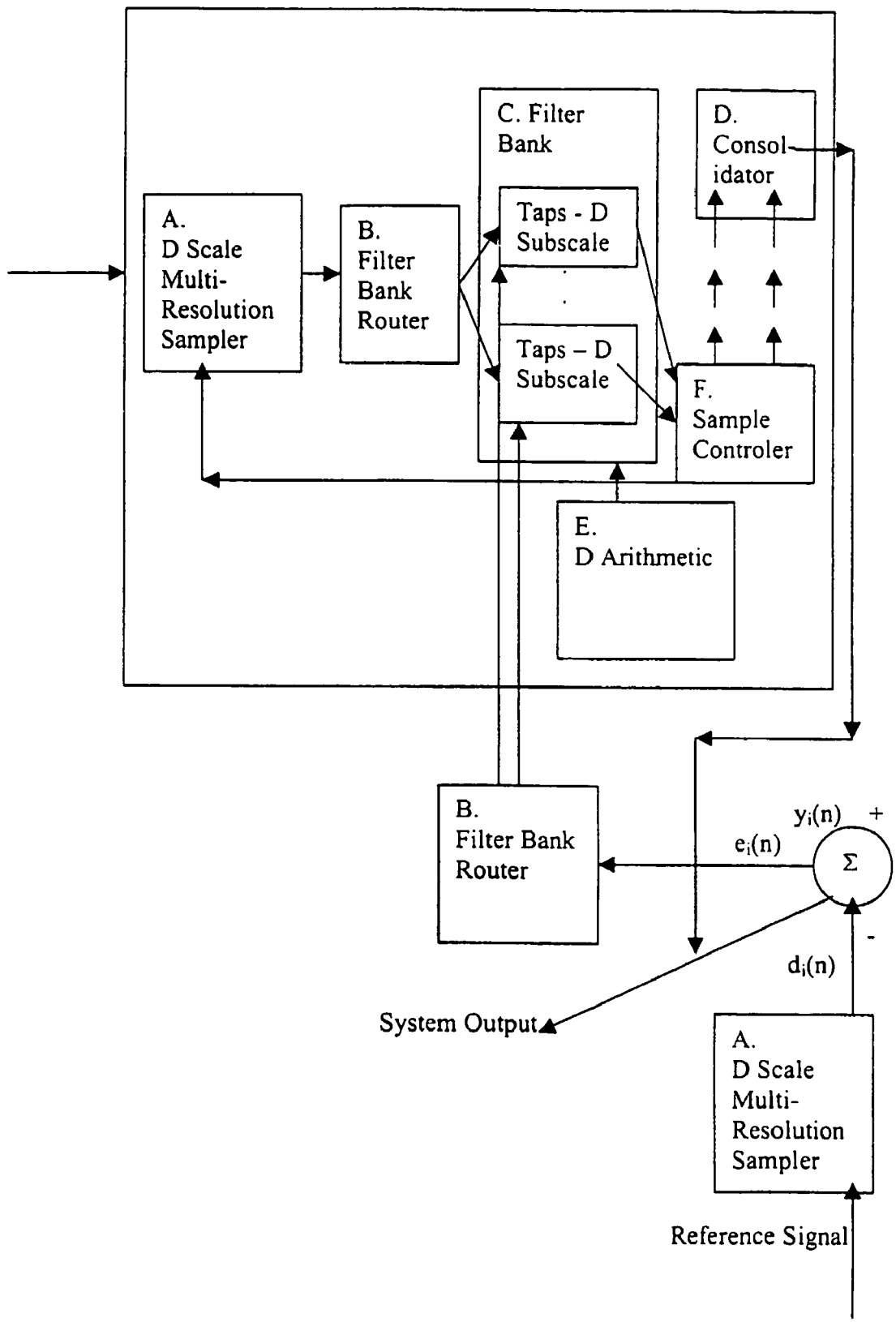

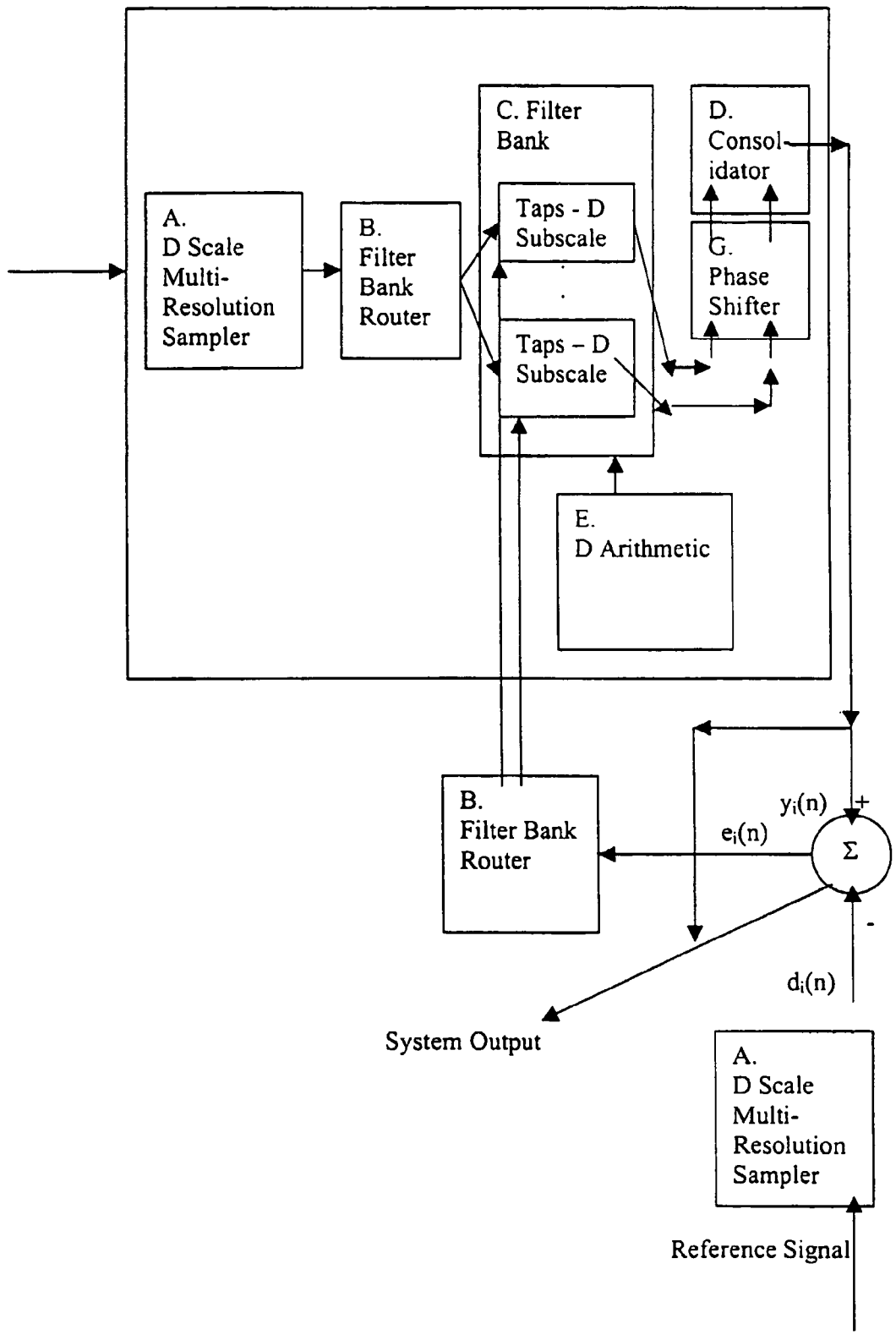
Figure 10: D Filter with Phase Modulator for Positive, Negative and Phase Lock Feedback Loops Figure 11: Possible D Filter Configurations
Configuration A: Pre-filtering Application
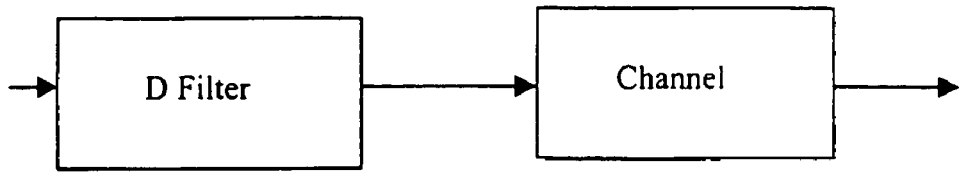
Configuration B: Post-filtering Application
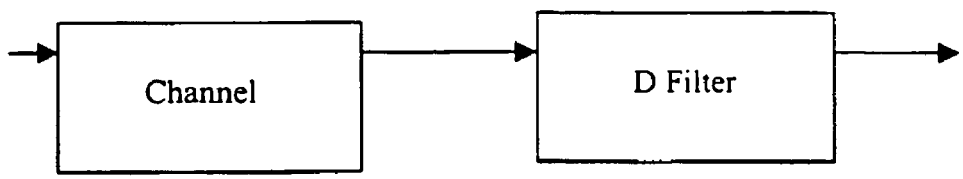
Configuration C: Adaptive Filtering Application
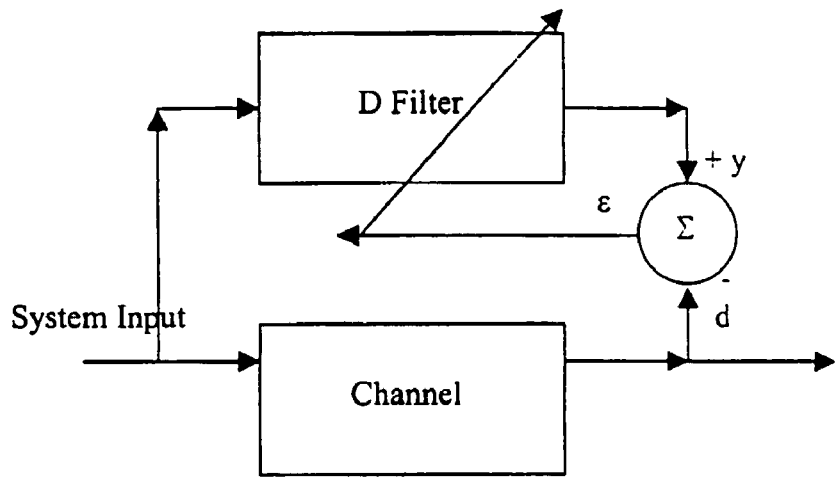
Configuration D: Adaptive Filtering Application
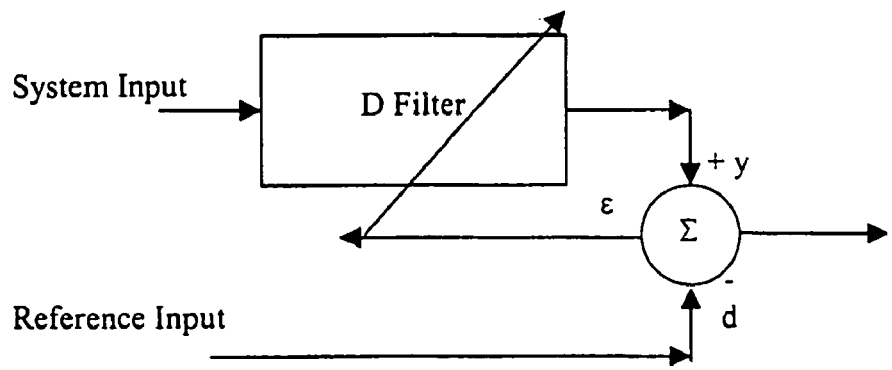

Figure 12: Multi-Resolution D Scale Sampler Designs
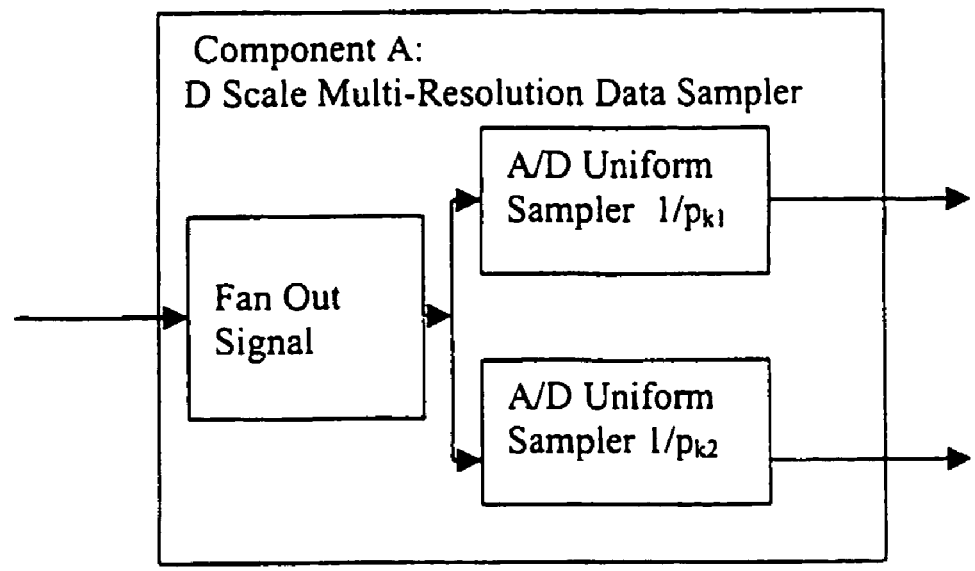
Or
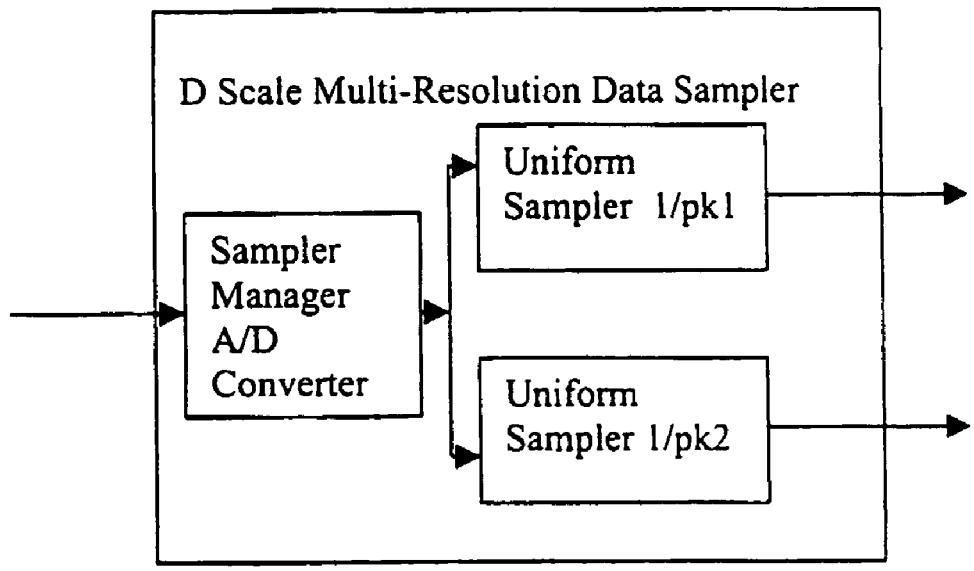

Figure 13: D Digital Filter Bank and Sample Router
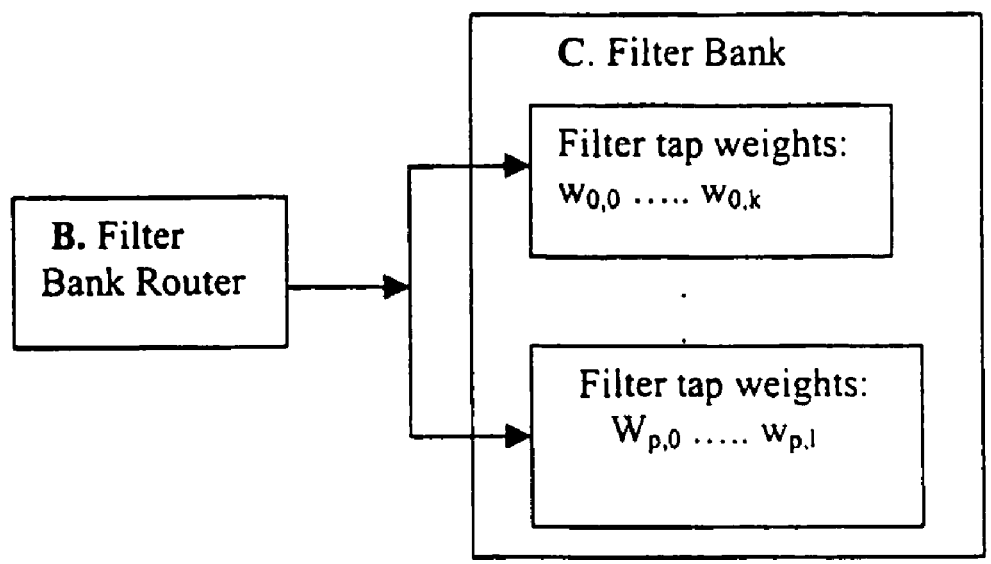

Figure 14: Filter Bank Router
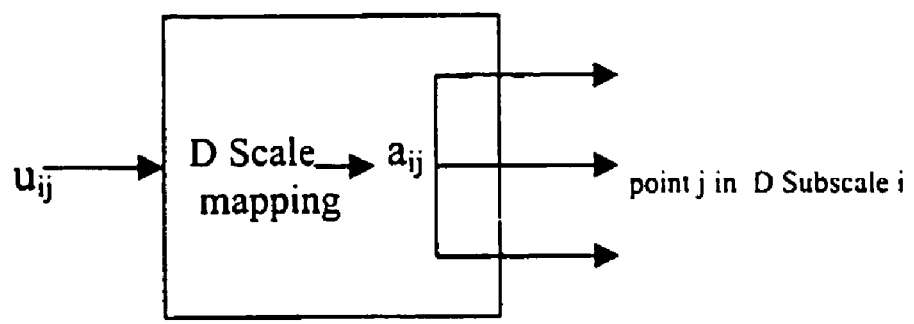

Figure 15: Internal Architecture of FIR D Filter Bank
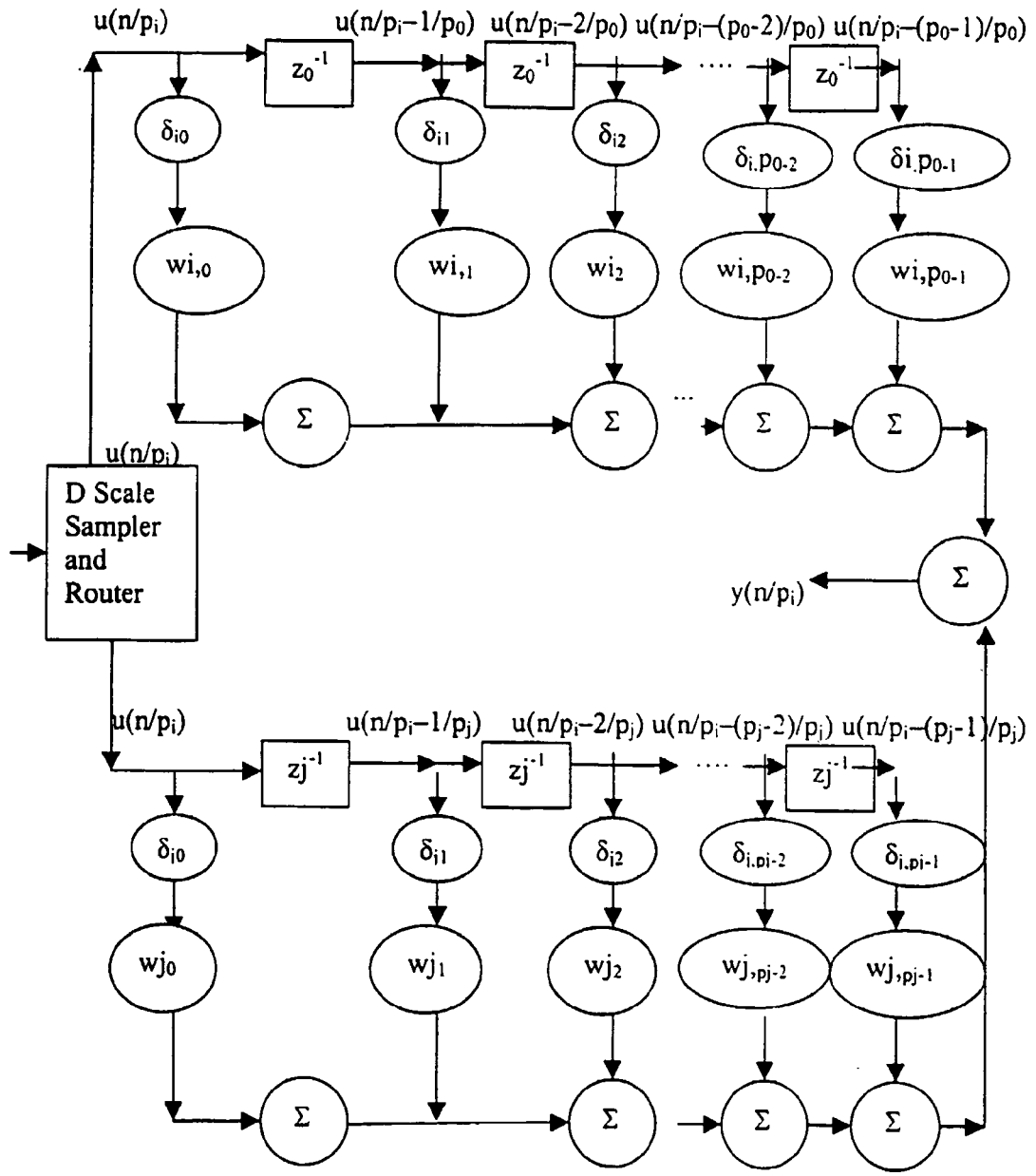

Figure 16. D Signal Description
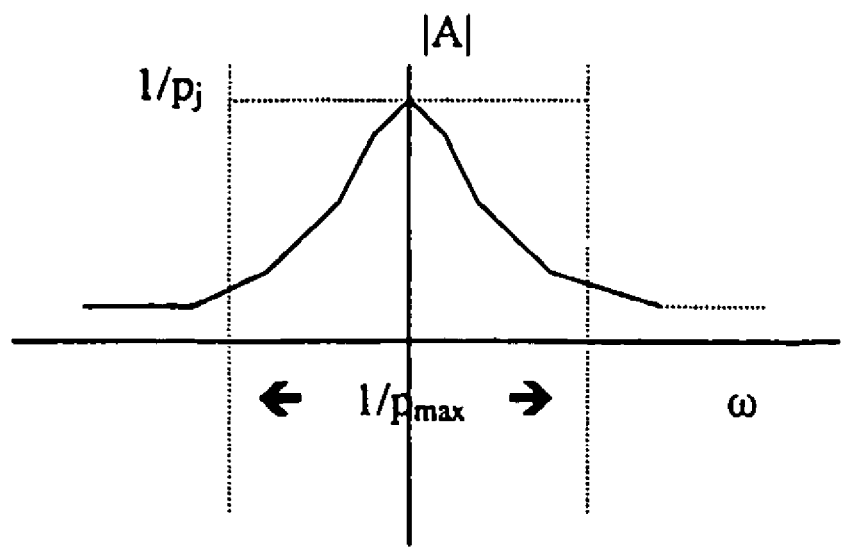

Figure 17: Characterizing Certain Nonlinear Systems
For D Digital Filter Design
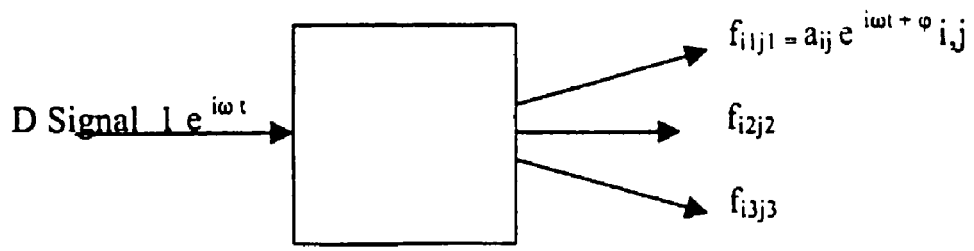
i = i-th D subscale
j = j-th point on the I-th D subscale Figure 18: Frequency Domain Analysis of Nonlinear Systems
Case A:
D Signal Input
D Signal output due to input D Signal subscale j
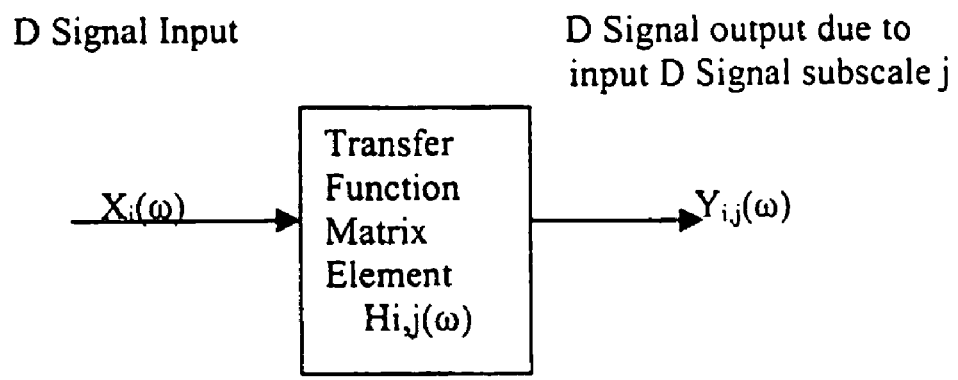
Case B:
D Signal Inputs
D Signal output due to contributions from all All D Signal inputs.
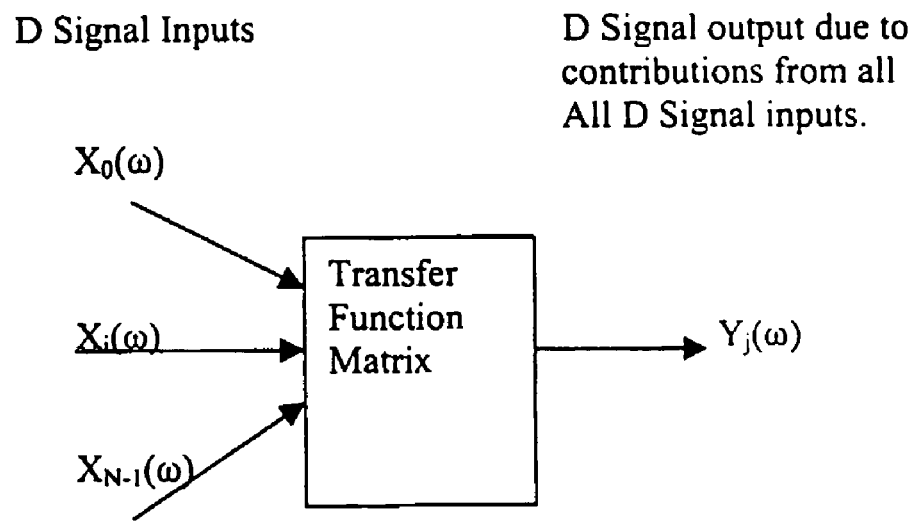

Figure 19: Procedure to Characterize Nonlinearities in Input-Output Amplitudes or Phases
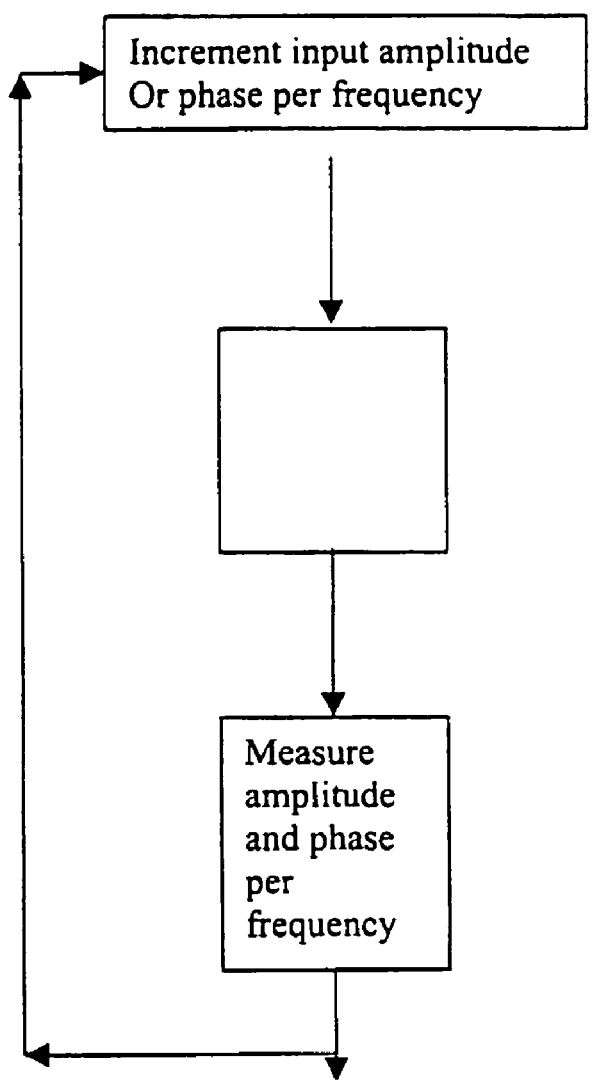

Figure 20: Methodology for Empirically Measuring Impulse Response of a Linear or Non-linear System
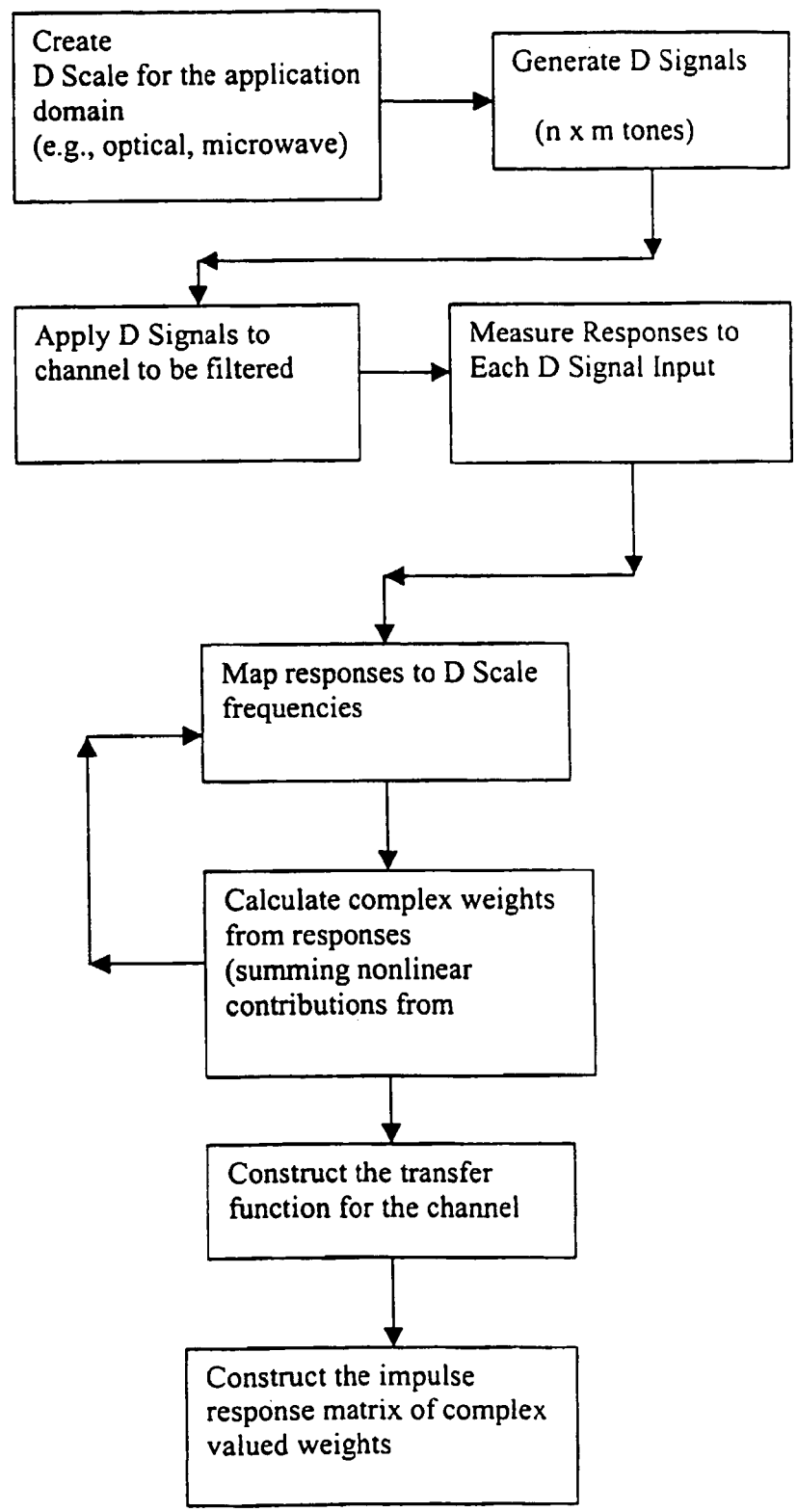

Figure 21: Standard Digital Filtering Model for Weiner-Hopf Derivation
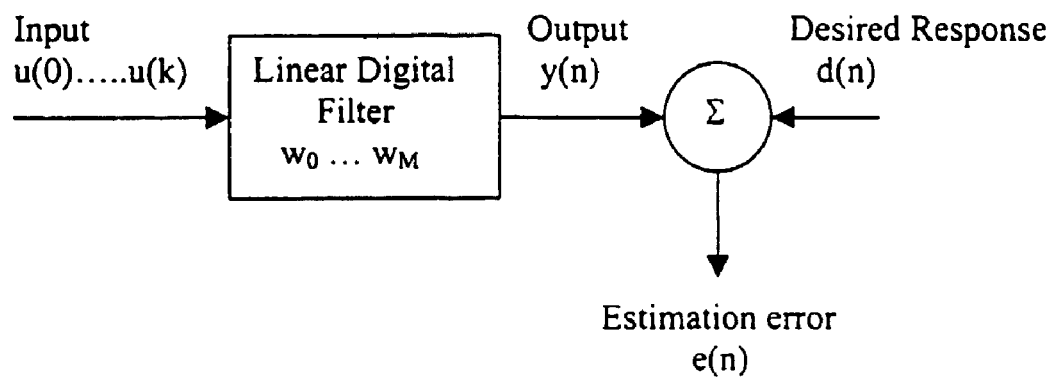

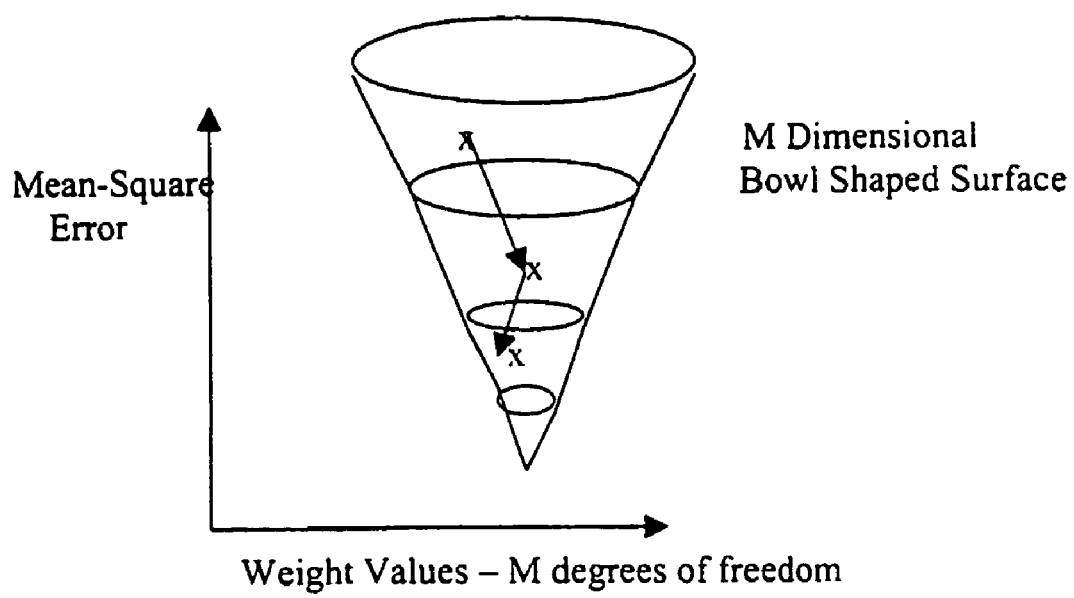
Figure 22. Standard Geometric Interpretation of Solution to the Weiner-Hopf Equation:

Figure 23: Digital Filtering Model for Generalized Weiner-Hopf Derivation
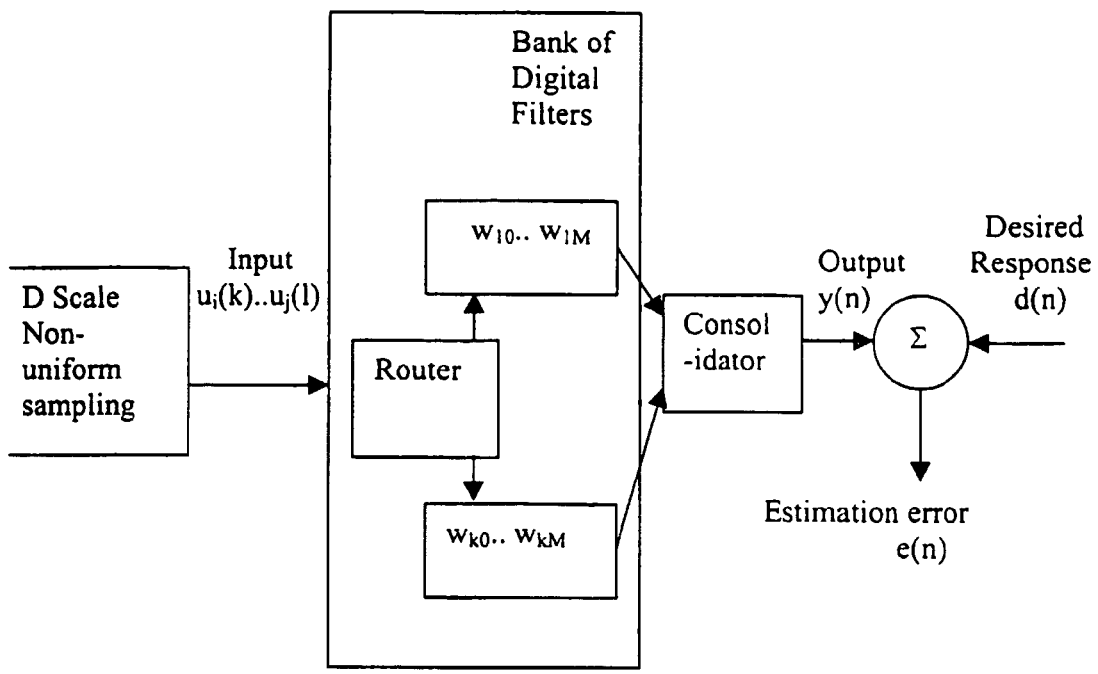

Figure 23A Standard Continuous Weiner Filter Architecture
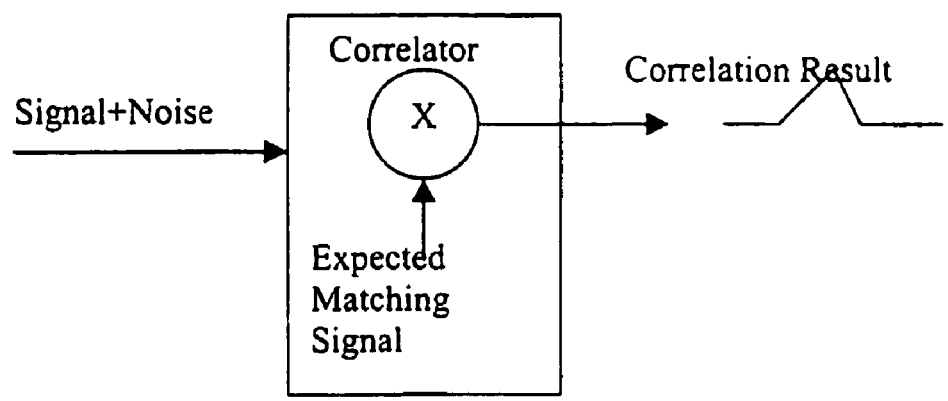

Figure 24. Geometric Interpretation of Solution to Generalized
Weiner-Hopf Equation:
Multiple $M_i$ Dimensional Bowl Shaped Surfaces, $0 <= i <$ Number D subscales
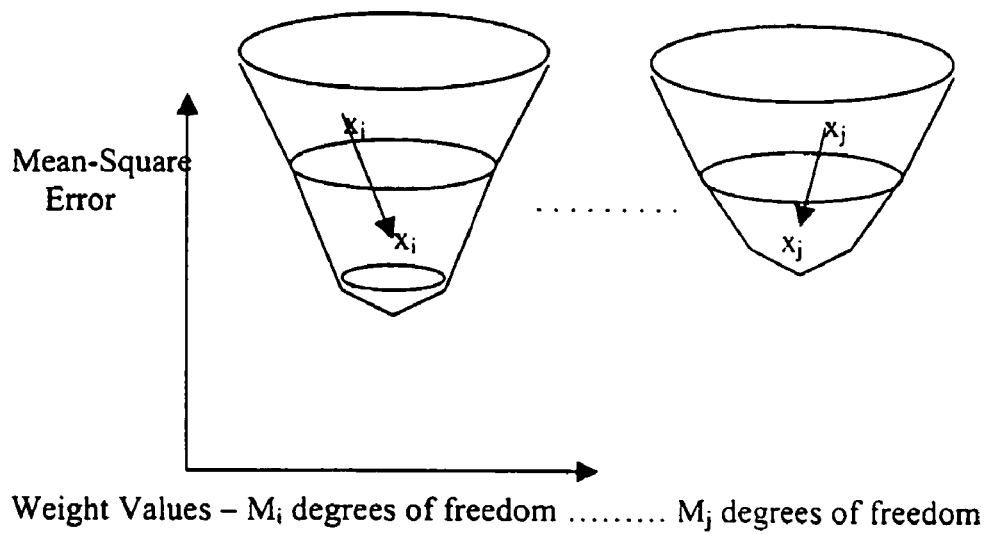
Weight Values – $M_i$ degrees of freedom ......... $M_j$ degrees of freedom Figure 24A Standard Discrete Weiner Filter Architecture
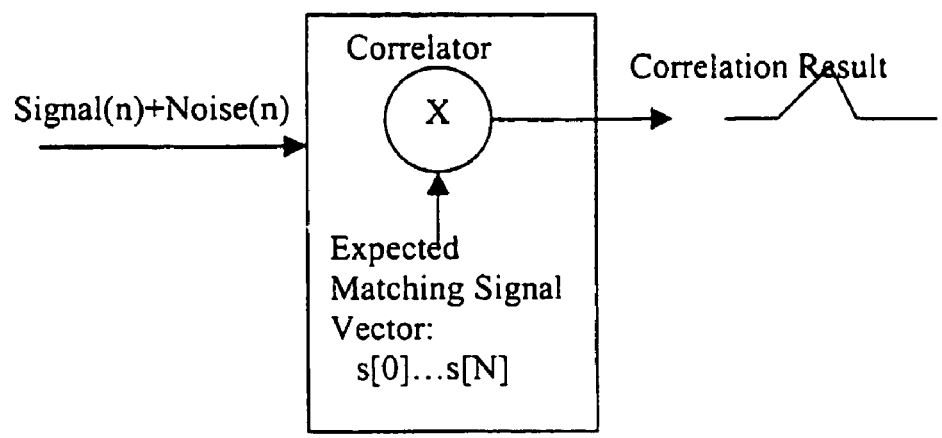

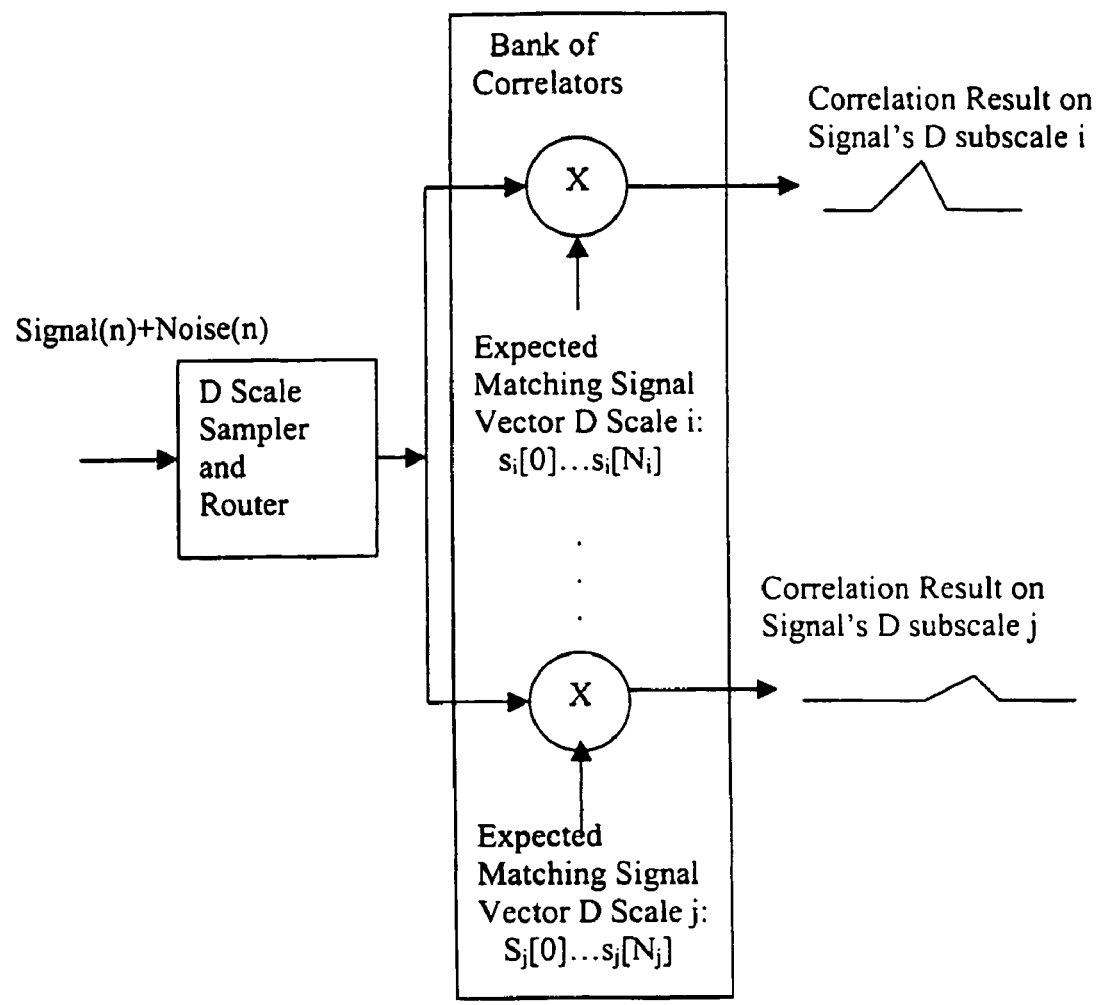
Figure 25: Generalized Weiner, Matched, Filter

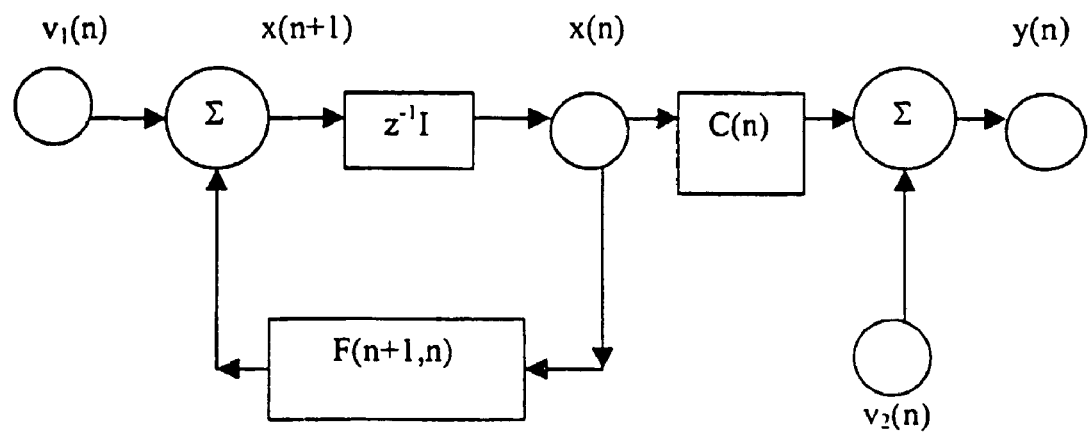
Figure 26: Signal Flow Graph Underlying Standard Linear Kalman Filter Derivation

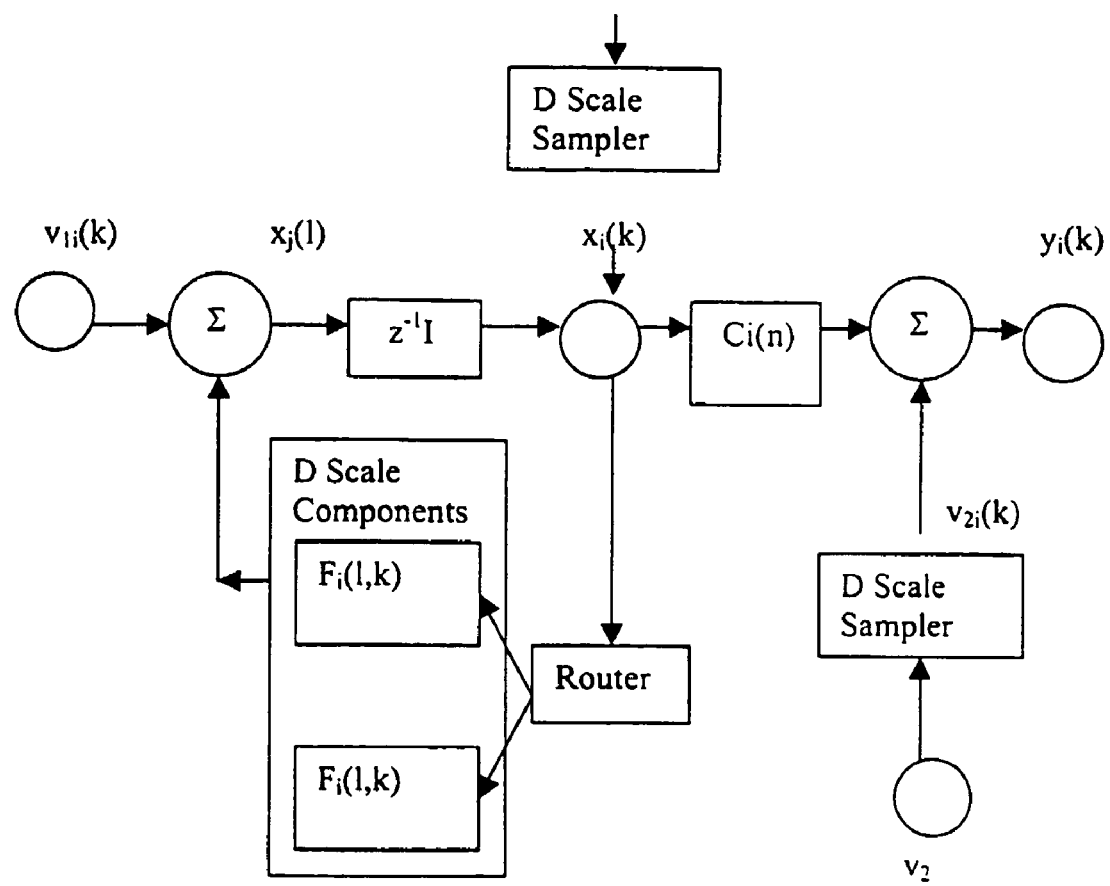
Figure 27: Signal Flow Graph Underlying Generalized Kalman Filter Derivation Figure 28: Generalized Kalman Filter Loop
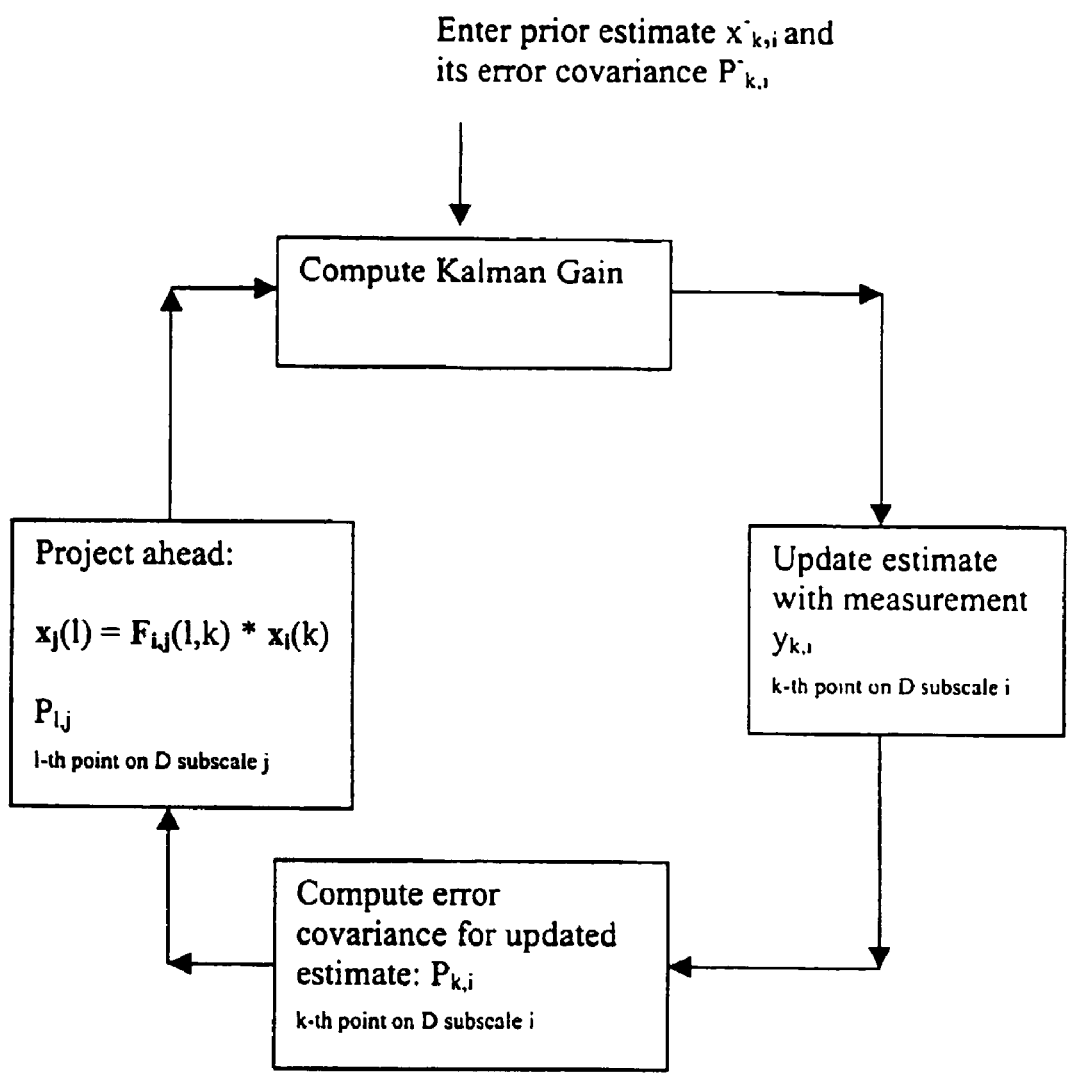

N DIMENSIONAL NON-LINEAR, STATIC, ADAPTIVE, DIGITAL FILTER DESIGN USING D SCALE NON-UNIFORM SAMPLING

FIELD OF THE INVENTION

This invention concerns N dimensional digital filter design in its broadest sense. Filters are used to restrict or sculpt 1D signals, 2D/3D images or more abstract N dimensional objects that traverse communications channels. They are also used for data smoothing and prediction, signal detection and noise reduction applications.

Typically, digital filters rely on the Finite Impulse Response (FIR) and Infinite Impulse Response (IIR) linear mathematical models. Data inputs to these models are almost always assumed to be uniformly spaced sample points. Various filter architectures use these underlying models to accommodate diverse application categories, to include:
   a. Static filtering (e.g., baseband, passband, notch)
   b. Adaptive and equalizing filters
   c. Weiner or matched filtering
   d. Kalman filtering This invention also concerns novel uses of digital filters to modulate positive and negative feedback loops in control systems as well as to enhance digital phase lock loops.

Further, this invention extends the domain of applicability of digital filter techniques to a certain range of nonlinear systems.

Finally, this invention encompasses the derivative work of exactly calculating the n-th level autocorrelation and cross-correlations of N dimensional signals as well as convolutions.

BACKGROUND OF THE INVENTION

This discussion is confined to one dimensional (1D) filters because the N dimensional case is readily generalized from the 1D case.

A 1D filter is characterized by a vector of possibly complex valued weights or parameters. These weights are the tap values in a transversal filter arrangement. These weights are derived from the discrete approximation to the continuous convolution of an input signal and the impulse response of the system to filter. The convolution characterizes the filter's impact on the input signal, as follows:

$$y(t) = \int_{-\infty}^{+\infty} h(t-\tau)u(\tau)d\tau$$

where $u(\tau)$ is the input signal and $h(t-\tau)$ is the (non-causal in this case) impulse response of the system shown in FIG. 1.

The impulse response of a system is the result of applying a sharp spiked signal at the input. The spiked signal is a discrete approximation to the unrealizable impulse of zero duration and infinite amplitude (defined using the Dirac delta functional). The idealized spectrum of impulse is flat with unit amplitude and constant phase.

The discrete approximation of the impulse response is:

$$y(t) = \int_{-\infty}^{+\infty} h(t-\tau)u(\tau)d\tau \approx 1/N \sum_{k=0}^{k=N-1} h(n-k)u(k)$$

where 1/N is the uniform, Nyquist, sampling rate used to digitize the continuous signal.

Digital filters for linear systems are categorized as Finite-Impulse Response (FIR) or Infinite Impulse Response (IIR) in architecture. The IIR occurs when the output at one sample time is fed back as input to the next sample event. FIGS. 2 and 3 depict a general purpose FIR or IIR digital filter, respectively, with both architected as a transverse filter.

There are many varied techniques for designing digital filters. Static filter design entails the determination of static tap weights for specific problem domains, bounded by requirements and resource constraints. Adaptive digital filters result when the tap weights are allowed to vary, typically depending on a comparison of the actual output to a reference output. Typically, the Weiner-Hopf equation provides the analytical basis for calculating an adaptive filter's optimal tap weights.

CURRENT STATE-OF-THE-ART DESCRIPTION OF KNOWN SOLUTIONS

The current state of the art in digital filter design encompasses a wide range of solutions to the underlying equations that determine the filter weights. These techniques are generally categorized by the filter architecture, to include:
   a. Linear Filter Design Algorithms
   b. Somewhat Nonlinear Filter Design Algorithms
   c. Adaptive and Equalizing Filters
   d. Weiner or Matched Filters
   e. Kalman Filters Deficiencies of Existing "Prior Art"
   The prior art is generally based on the following premises:
   a. Linear systems models.
   b. Approximation of the Fourier Transform via the Discrete Fourier Transform (DFT). This is a fair approximation under best signal condition, and potentially considerably worse for transient and non-stationary signals.
   c. Generally periodic, stationary signals.
   d. Decoupling of sampling from filtering operations. That is, sampling is performed with whatever approach independently of the filtering results.
   e. Uniform sampling of the input signal.

BRIEF DESCRIPTION OF THE INVENTION

The N dimensional digital filter design is generalized in a straight-forward manner from the 1D case. Therefore the description will focus on the 1D case. An N dimensional object will then be referred to as a signal, using the 1D terminology.

The motivation for this invention evolved from a realization that a critical component was excluded from the typical information flow through digital filters. This flow is illustrated in FIG. 4. Inputs can typically include the current input sample, previous samples, a priori knowledge and reference data. But the A/D sampler is not directly incorporated into the actual filter. Thus, standard filter design typically begins with a vector of uniformly sampled input data.

Fundamentally, non-uniform sampling of a volatile signal can glean more information about a signal than uniform sampling at the Nyquist rate (if indeed that rate is known a-priori). Additional information might be gleaned from simultaneous pseudo-random non-uniform sampling, along with trend or volatility sampling. Relative to judicious non-uniform sampling, uniform sampling can be sub-optimal in collecting information per unit of effort expended.

This filter design invention, named the D digital filter, extracts that additional information from the non-uniform sampling of signal volatility to improve the effectiveness and performance of the filter's intended application. The performance measure or metric used depends on the application. For example, for standard noise filtering and signal smoothing applications, the D filter is designed to sharpen spectrum cutoff and to minimize ripples in the frequency spectrum, while preserving phase. Or, for adaptive applications, the D filter is designed to accurately or closely track changes from a reference condition, with fast response time. FIG. 5 illustrates the information flow through a filter with sampling incorporated.

This invention is of a digital filter design comprised of up to seven (7) components, shown in FIG. 6. The components actually used in any implementation will depend on the application. Typically, adaptive filtering design will use many of the design components while static filters the fewest number.

The D Filter Design Components Are:

A. D Scale Multi-Resolution Input Sampler

B. Filter Bank Router

Filters can be applied to output streams following traversal through a channel as well as to inputs. Each point in the output stream might be shifted relative to its position in the input stream. This component then maps each point to a transversal filter in the bank of filters that is associated with a particular D subscale.

C. Digital Filter Bank

Each filter in the bank implements a vector of tap weights using The standard FIR and IIR architectures shown in FIGS. 2 and 3 respectively. Each filter is associated with one D subscales, and the number of taps is the size of the D subscale. Collectively, the filter bank then implements the D Scale underlying the sampling.

D. Consolidator

This component consolidates or interleaves the multiple, uniformly sampled D Subscale streams into one non-uniformly spaced stream.

E. Arithmetic Mappings (Networked Tables)

This optional component is used to implement the various real time calculations on the sample values.

F. Sampler Controller

This component sends control signals back to the sampler, to dynamically change the sampling behavior on the input.

G. Phase Shifter

This component modifies the phase of output samples for each D subscale (via a delay). A motivation is to modulate or control positive, negative and phase lock feedback loops.

Several illustrations are presented to highlight the scope of mix-and-match of these components. FIG. 7 shows the static D filter design. And FIG. 8 shows the Adaptive D filter design, both derived from the D filter components.

Further, the D Filter components might be used to modulate the input sample streams based on the output. This can be implemented using control signals that are based on the output, and then applied to the input samplers. The applied control signals would then suppress or trigger certain D subscale samplers in various frequency ranges. The Sampler Controller module can serve that function. FIG. 8 shows a D filter arrangement that implements this sampling feedback loop.

Also, it might be desirable to modify the phase of an output or an input signal. The Phase Shifter component could fulfill that purpose, as shown in FIG. 9.

A D Filter can be applied in many configurations, identically to the standard digital filters. FIG. 11 shows several possible static and adaptive D filter configurations.

The D filter design derives directly from the capabilities of the D Scale (U.S. Pat. No. 6,477,553 issued Nov. 5, 2002), non-uniform sampling using the D Scale, the D Arithmetic (U.S. Pat. No. 6,757,700, issued Jun. 29, 2004), and on the exact Fourier transform decomposition of a signal via D Scale sampling. Collectively, they provide the rigorous mathematical modeling justification for the D filter structure and operation.

A signal structure is also introduced to aid the characterization of a channel for the construction of a D digital filter. Further, industry standard static and adaptive digital filter designs are special cases of the D filter design when only uniform sampling is used. For then, the sampler is simply an A/D device, the filter bank reduces to one filter and there is no routing to a filter bank.

The D filter is also an evolutionary design, for it extends and extrapolates current filter design techniques. This preserves the investment in the vast installed base of digital filters.

Highlight of the D Digital Design Include:

1. Enhanced IIR digital filtering by increasing its stability while minimizing the number of tap weights. Stability is the main constraint to wider applications of current state-of-the-art IIR filters.
2. Sharper or finer "sculpting" of a channel's bandwidth to achieve the same filtering effect as the usual designs, but with reduced number of tap weights. Alternately, the same number of taps as in a standard filter yields heightened filtering impact.
3. Capability to retrofit existing filter designs because of its backward compatibility.
4. Evolutionary design is built on the existing framework of current digital filters. This reduces implementation risk as well as preserve the investment in the installed base.
5. Mix-and-match component approach lends itself to solving many varied problem in diverse application domains.
6. D Arithmetic self-stabilizing arithmetic further enhances the
7. stability of IIRs and of adaptive filters.
8. Efficiencies due to fine level of input sample filtering as well as feedback from output back to input sampler.

BRIEF DESCRIPTION OF THE DRAWINGS

FIG. 1 depicts an Industry Standard Linear Systems Model.
FIG. 2 depicts a Transversal FIR Digital Filter
FIG. 3 depicts a Transversal IIR Digital Filter.
FIG. 4 depicts general information flow through a digital filter.
FIG. 5 depicts the general information flow through a digital filter incorporating a D scale sampler.
FIG. 6 depicts a maximal arrangement of D FIR/IIR filter design components.
FIG. 7 depicts a static D filter design.
FIG. 8 depicts an adaptive D filter design.
FIG. 9 depicts a D filter with a sample controller.
FIG. 10 depicts a D filter with a phase modulator for positive, negative and phase lock feedback loops.
FIG. 11 depicts possible D filter configurations.
FIG. 12 depicts multi-resolution D scale sampler designs.
FIG. 13 depicts a D digital filter band and sample router.
FIG. 14 depicts a filter bank router.

FIG. 15 depicts an internal architecture of an FIR D filter bank.

FIG. 16 depicts a D signal description.

FIG. 17 depicts the characterizing of certain nonlinear systems for D digital filter design.

FIG. 18 depicts a frequency domain analysis of nonlinear systems.

FIG. 19 depicts a procedure to characterize nonlinearities in input-output amplitudes or phases.

FIG. 20 depicts a methodology for empirically measuring the impulse response of a linear or non-linear system.

FIG. 21 depicts a standard digital filtering model for a Weiner-Hopf derivation.

FIG. 22 depicts a standard geometric interpretation of a solution to the Weiner-Hopf equation.

FIG. 23 depicts a digital filtering model for a generalized Weiner-Hopf derivation.

FIG. 23A depicts a standard continuous Weiner filter architecture.

FIG. 24 depicts a geometric interpretation of a solution to the generalized Weiner-Hopf equation.

FIG. 24A depicts a standard discrete Weiner filter architecture.

FIG. 25 depicts a generalized Weiner matched filter.

FIG. 26 depicts a signal flow graph underlying a standard linear Kalman filter derivation.

FIG. 27 depicts a signal flow graph underlying a generalized Kalman filter derivation.

FIG. 28 depicts a generalized Kalman filter loop.

DETAILED DESCRIPTION

Contents
1. Detailed Description of D Digital Filter Components
   1.1 D Scale Multi-Resolution Input Sampler
   1.2 Digital Filter Bank
   1.3 Sample Router
   1.4 Multi-Stream Consolidator
   1.5 Phase Shifter
   1.6 Sampling Feedback Loop
   1.7 D Arithmetic Tables
2. Rationale for D Digital Filter
   2.1 Decomposition of Convolution Integral
   2.2 Internal Architecture of D Filter Bank
   2.3 D Signal
   2.4 Nonlinear Systems Addressed by D Filter Design
   2.5 Method for Empirically Measuring Impulse Response of a Linear or Nonlinear System
3. Application of D Filter Design
   3.1 Linear Filter Design Algorithms
   3.2 Nonlinear Filter Design Algorithms
   3.3 Filters Derived from Weiner-Hopf Equation
   3.4 Benefits of Generalized Weiner-Hopf Equation on Adaptive Filters
   3.5 Computing Autocorrelation and Cross-Correlation
   3.6 Generalized Kalman Filters 1. Detailed Description of D Digital Filter Components 1.1 D Scale Multi-Resolution Input Sampler Patent application Ser. No. 09/326,084 describes how the D Scale sampler can be implemented by multiple off-the-shelf, commercially available analog-to-digital (A/D) converters. Each A/D device samples uniformly at a rate determined by that D Scale's subscale resolution. An extra component is required to distribute or dispatch or fan out the original analog data stream into multiple feeds, one per D subscale sampler. Then each sampler filters out all but its subscale points. FIG. 12 illustrates two possible multi-sampler designs.

1.2 Digital Filter Bank

The heart of the D Digital Filter design is a bank of ordinary, commercially available IIR or FIR digital filters, as shown in FIG. 2. Each filter in the bank is associated with a subscale of the underlying D Scale used for sampling. That is, each filter independently samples the incoming data at the rate of its associated D subscale.

A 1 dimensional (1D) D digital filter is characterized by a vector of of vectors of complex valued parameters or tap weights. This vector of vectors corresponds to the individual D subscales in the underlying D Scale used for the non-uniform sampling. It is realized by a bank of the usual digital filters, with each characterized by one vector of tap weights from the vector of vectors. The weights are the coefficients of the discrete impulse response.

1.3 Sample Router

Additionally, a router component directs each new sample to a filter in the filter bank. This generalizes the usual 1D digital filter, that is characterized by a vector of weights. FIG. 13 illustrates the architecture. FIG. 14 provides a close up of the filter bank router. This component first maps each incoming point into a D Scale point, if the point is not already a D Scale point. It then routes the mapped point to that filter in the D filter bank corresponding to the D subscale containing the mapped point.

1.4 Multi-Stream Consolidator

This component consolidates the multiple D subscale uniform sample streams into one stream consisting of interleaved samples from the multiple D subscale streams. The net result is one stream of samples flowing at a non-uniform rate.

1.5 Phase Shifter

This component changes the phase of processed D subscale point streams (or signals). It performs this task by delaying the passage of each D subscale point by a predetermined value. In effect, the phase shifter transforms a point on one subscale into a point on another subscale or even onto the same subscale, but at a different frequency. A phase shifter might be useful for applications involving positive and negative feedback loops.

1.6 Sampling Feedback Loop Controller Component

The feedback loop can selectively feedback control messages or signals to the D Scale sampler at the input stream. These control signals effectively modulate the input stream that actually passes through the channel being filtered. This mechanism adds a new input sampling strategy, in addition to random and trend sampling. FIGS. 6 and 9 illustrated where this component can be integrated into the D filter design.

1.7 D Arithmetic Tables

The D Arithmetic is detailed in patent application Ser. No. 09/568,368. Actual floating point measurements or sampled values are mapped to D Scale points. Arithmetic operations are performed on these points by mapping the floating point result of the arithmetic operation on each pair of operands into another D Scale point. Scaling is properly preserved as well when the D Arithmetic tables are created. A table can be a physical region in memory of a computer host. Or it can be a logical table of references or pointers to a network of physical tables distributed across multiple computers.

The D Arithmetic tables can be readily integrated into a filtering system to perform the calculations, which become iterative mappings across D Arithmetic table mappings. The D Arithmetic is portable and it does not have floating point operation overflow, underflow or divide-by-zero conditions. Further, it has a self-stabilizing property that effectively bounds round-off errors to within a tolerance value. This tolerance depends on the minimum possible distance between all adjacent points in the D Scale that underlies the D Arithmetic tables.

Therefore, use of the D Arithmetic in filter design can diminish, if not mitigate entirely, the corrosive effects of floating point calculations in filter design.

2. Rationale for D Digital Filter Bank Design

2.1 Decomposition of Convolution Integral

The motivation, indeed, the underlying mathematical justification, for this design is first presented followed by details on determining the filter's tap weights.

As mentioned previously in the background section and as shown in FIGS. 2 and 3, the vector of weights in an industry standard digital filter derives from the standard discrete approximation of the convolution integral of a signal and the impulse response of a channel.

These N complex coefficients are the tap weights in a transversal digital filter. The rationale for this linkage of coefficients to filter taps is that the vector of tap weights approximates the impulse response of a linear system.

However, the D Scale can be applied to calculate the exact convolution of a complex function. Consider the same linear system illustrated in FIG. 1. Let the D Scale be comprised of N subscales $\{p_1, \ldots p_N\}$.

Let $\delta_{ij}$ denote the distance of point $p_j$ in D subscale i to the next D Scale point. Recall that the sampling is uniform at a rate of $1/p_i$ for each subscale i. Therefore, for points on subscale i:

$$t = n/p_i \text{ where } n = 1, \ldots p_i - 1$$

(Note that for the smallest scale, $p_{min}n$ starts at 0. That is, the convention is that the smallest scale contains the 0 D Scale point).

Further, the convolution integral can be decomposed using Riemann summation over the D subscales, identically to the procedure used to derive an exact decomposition of the Fourier Transform in patent application Ser. No. 09/326,084. The continuous convolution integral is calculated by determining its value separately at points on each D subscales.

On each subscale $p_j$, the integration variable $\tau$ extends over uniform intervals $1/p_j$. Therefore on each subscale:

$$\tau = k/p_j$$

Also, on each subscale, the non-uniform interval associated with each uniformly distributed D Scale point leads to:

$$d\tau \to \delta_{j,k}$$

$$y(t) = \int_{-\infty}^{+\infty} h(t-\tau)u(\tau)d\tau = \int h(\tau)u(t-\tau)d\tau \approx$$

Decomposition of Convolution into D Subscale Filters $$y(n/p_i) = \sum_{j \in \{p_1, \ldots p_N\}} \sum_{k=0}^{k=p_j-1} h(k/p_j)u(n/p_i - k/p_j)\delta_{j,k}$$

$$n = 1, \ldots p_i - 1$$

This expression is then used to calculate the continuous convolution integral across the range of interest, by assembling the calculated convolution values along points on each D subscale. Again, this procedure is identical to that described in patent application Ser. No. 09/326,084 to calculate an exact decomposition of the Fourier Transform of a transient signal. The approximation becomes more exact as more D subscales are used, which increases the resolution of the D Scale.

2.2 Internal Architecture of D Filter Bank

Note that this discrete approximation to the continuous convolution integral contains N of the usual discrete impulse response convolution series, one for each D subscale. This is the key observation to establishing the link between the coefficients of these series and the D filter bank tap weights. For consider the following slight rearrangement of the terms in this equation:

Let a weight be denoted by:

$$w^*_{j,k} = h(k/p_j) \delta_{j,k}$$

where the asterisk denotes complex conjugation, which assumes that the tap inputs, and therefore the tap weights are all complex valued. Then:

$$y(n/p_i) = \sum_{j \in \{p_1, \ldots p_N\}} \sum_{k=0}^{k=p_j-1} w^*_{j,k} u(n/p_i - k/p_j)$$

The equation can now be interpreted in the language of filter weights. For each internal summation convolves the finite duration impulse response of one filter, represented by the vector $w^*_{j,k}$ for D subscale j, with the input $u(n/p_i)$ from D subscale i, to produce an output contribution $y(n/p_i)$ for a point on D subscale i. FIG. 15 illustrates the internal structure of an FIR D filter bank that realizes this equation. Note that the conventional unit delay box $z^{-1}$ has an additional subscript associated with the D subscale. $z_0^{-1}$. The intent is to highlight the variable "unit" interval as it depends on the D subscale.

The D filter bank of IIR filters follows the same pattern whereby the D Scale $\delta_{j,k}$ values are multiplied with the original weights and a set of N conventional IIR filters are tied to a D Scale sampler and router.

2.3 D Signal

2.3.1 Motivation

The preceding equations assumed that the impulse response of a system was already known. There is a then a need to actually determine or measure the impulse response of a system (or channel). The standard theoretical approach is to discretize the Dirac functional as follows:

$$h(t) = \int_{-\infty}^{+\infty} h(\tau)\delta(t-\tau)d\tau \approx \sum_{n=-\infty}^{+\infty} h(n\Delta\tau)\delta(t-n\Delta\tau)\Delta\tau$$

The effect of any input x(t) to the linear system is then determined using the system's linearity property as:

$$y(t) = \int_{-\infty}^{+\infty} h(\tau)x(t-\tau)d\tau \approx \sum_{n=-\infty}^{+\infty} h(n\Delta\tau)x(t-n\Delta\tau)\Delta\tau$$

The approximation of the continuous Dirac impulse response is a spike of unit amplitude. Note that phase is ignored in this procedure.

The motivation for the D Signal is the set of equations in patent application Ser. No. 09/326,084 on an exact decomposition of the magnitude and phase of the Fourier transform of a signal using non-uniform D Scale sampling. The equation for the magnitude decomposition is:

$$|F(2\pi m/Tp_i)| = \sum_{j\in\{p_1,\ldots p_N\}} \sum_{k=0}^{k=Tp_k*p_k-1} \delta_{pk,n/pk}h(n/p_i)e^{-2\pi(Tp_k Tp_i)nm/(T_{pk}*p_k)}$$

The decomposition consists of a double sum of terms with each term of the form:

$$\delta_{pk,n/pk}h(n/p_i)e^{-2\pi(Tp_k/Tp_i)nm/(Tp_k*p_k)}$$

The inverse Fourier Transform decomposition is used to determine the shape of a signal derived from a specified frequency spectrum.

2.3.2 Relation to Impulse Function

These decomposition equations can be interpreted as a formula for measuring the impact of a channel or system on linear combinations of certain atomic or elemental signals. An elemental signal is one term in the decomposition, whether forward or inverse.

Let a D Signal be one of the terms in the decomposition above. Then any (reasonably well behaved) signal can be decomposed into a set of D signals. The D signal, then realizes a D Scale point. It is characterized by a predominant monotonic frequency at the rate of the subscale's generator. If prime numbers are used, then the dominant frequency is $1/p_k$ where k is the $k^{th}$ subscale in the D Scale used. In practice, there will be a spread, quantified by a variance, in the frequency spectrum of the D Signal. This variance must be within the maximum distance between adjacent points of the D Scale, as shown in FIG. 16. This insures that each D Scale point's corresponding D Signal is distinct.

Thus, if a set of signals is desired with a flat frequency spectrum in a specified range, then the atomic terms can set their middle factor h( ) to 1. Further, if the phase is flat, then the exponential term simplifies considerably. The net effect of these constraints is a signal with a flat frequency and phase response. Indeed, by definition, that signal would realize the impulse in the defined frequency band. The D Signal approximation of an impulse response can be tailored to the frequency domain of interest, as in the microwave or optical frequency ranges.

2.3.3 Possible Uses of D Signals

One possible use of the D Signal is as CDMA signal components. Another use is to empirically measure the impulse response of a possibly non-linear system, discussed in more depth later.

2.4 Nonlinear Systems Addressed by D Filter Design Methodology:

Nonlinear systems exhibit a wide range of behavior. Consider that one end of the spectrum of behavior is almost linear (i.e, superposition and time invariance apply) while at the other end is extreme behavior such as expected at the rim of a black hole. The scope of nonlinear systems considered by the D filter design is bounded by the part of the spectrum to include non-time varying systems that exhibit deterministic, multi-frequency generation per monotonic or monochromatic frequency input.

The following methodology can be used to quantify such nonlinearities. First, a D Scale is created for the application domain considered, such as microwave, optical or millimeter regions. Then each unit amplitude D Signal associated with the D Scale is applied at the input. Because of the system's nonlinearities, outputs at multiple frequencies can be expected, as shown in FIG. 17. These output signals will have varied amplitudes and phases. And their frequencies can be mapped to D Scale frequency points. Again, the nonlinearities are assumed to be time invariant to enable reproduceable behavior. The net result of these efforts is that the output spectrum can be expressed as follows, illustrated in FIG. 18A:

$$Y_{ij}(\omega)=H_{ij}(\omega)*X_j(\omega)$$

Where:

$Y_{ij}$→Component of output D Signal associated with subscale i due to an input D Signal from D subscale j.

And the following results after collecting contributions from all input D Signal frequencies, as shown in FIG. 18B:

$$Y_i(\omega) = \sum_{j=0}^{N-1} Y_{ij}(\omega) = \sum_{j=0}^{N-1} H_{ij}(\omega)*X_j(\omega)$$

N=number of D subscales
0≤i<N−1

Where:

$H_{ij}$→Transfer function for input D signal associated with subscale j and output D Signal associated with subscale i.
$X_j$→Input D signal associated with subscale j.
$Y_i$→Output D Signal associated with subscale i.

Or in matrix notation, $$Y=H*X$$

Where:

H is an N×N matrix each of whose elements is a transfer function $H_{ij}(\omega)$
X is a 1×N vector of input D Signals Alternately, this can be expressed in the time domain. In that case, There are many impulse response functions to consider, one for each D Signal.

Note again, that for this general case contains the usual relationships between input and outputs, when the system is linear. For then, there is only one output frequency per input D Signal and the transfer function matrix only contains diagonal elements That is, $$Y_i(\omega)=H_{i,i}(\omega)*X_i(\omega)$$

Or as usually expressed in linear system theory:

$$Y(\omega)=H(\omega)*X(\omega)$$

Nonlinearities might also occur such that the change in output amplitude is not proportional to input amplitude changes. In that case, the same test methodology can be applied, but varying input amplitudes on each trial. That is, after a set of output signals is collected for a range of D Signal inputs at a set amplitude, a new set of D Signal inputs is applied, but with the amplitudes incremented. This procedure is illustrated in FIG. 19.

2.4 Methodology for Empirically Measuring Impulse Response of a Linear or Non-linear System The previous discussion can be summarized through the following procedural description. A flow chart illustrating the methodology is presented in FIG. 20.

2.5.1 Construct a D Scale for the Problem at Hand:

Decide on which subscales to include in a D Scale based on a-prior knowledge of the application domain.

2.5.2 Generate D Signals

Generate the D Signals corresponding to the D Scale points constructed in the previous step. Just use the steady state part of the signal.

2.5.3 Apply D Signals

Apply the D Signals to the channel of interest, to determine the impulse response.

2.5.4 Measure the responses for each signal application.

There is a matrix of input signals. Note that in the D Scale range, nonlinearities can create multiple output frequency results per input frequency. Therefore each output is the composition of multiple contributions from D Signals.

2.5.5 Calculate the Transfer Function Matrix as Follows:

$$H_{ij}(\omega)=Y_{ij}(\omega)/X_j(\omega)$$

2.5.5 Calculate the impulse responses by taking the Fourier Transform of the calculated transfer functions. The D Scale decomposition should be applied, rather than the standard, coarse, DFT approximation. This effort will yield a vector of vectors of possibly complex coefficients.

3. Applications of D Filter Design

3.1 Linear Static Filter Design Algorithms

There are many well known and applied categories of linear filter design algorithms, and many implementation approaches within each category. For example, one approach is frequency domain sampling, while another approach, typically used for IIR designs, relies on complex plane mappings.

State-of-the-art digital filter design approaches typically perform two general steps. First is a determination of the digital filter architecture to use, based on the application requirements and resource constraints. The two basic architectures are Finite-Impulse-Response (FIR) or Infinite-Impulse-Response (IIR) filters. Second, a vector of possibly complex weights or transverse filter taps is calculated.

Each existing technique is readily generalized to the D filter design. For the D filter design is a direct generalization of the standard vector of tap weights. For example, the frequency sampling approach is generalized to use non-uniform D Scale sampling of a frequency spectrum, rather than the uniformly spaced samples usually applied. The same steps are then followed for the set of uniformly sampled D subscales. This same reasoning can be applied to each current digital filtering design approach.

Standard filter design entails the determination of the vector of tap weights of a filter. The three most commonly used FIR design approaches are, along with their D filter generalizations:

1. Frequency sampling

The desired frequency response is sampled uniformly at a sufficiently high rate. Then the discrete inverse DFT of the samples is calculated.

This technique is readily generalized for the frequency sampling can be performed non-uniformly using the D Scale. Then the inverse Fourier transform can be more accurately calculated using the D Scale samples.

2. Windowing

This technique entails multiplying the desired frequency response by a "windowing" function. The purpose is to reduce the impact of the Gibbs phenomenon when approximating the impulse response using the discrete DFT.

This technique is also readily generalized. For the inverse calculation can be performed more accurately allowing for more varied windowing functions.

3. Min-Max Optimization or Least-Mean-Square Error

This technique minimizes a mean-squared error criteria by solving a derived set of linear equations. Many algorithms are in use including Levison-Durbin, Parks-McClellan and Remez exchange, to note some of the most widely used ones.

This technique is also readily generalized for D filter design for the error measure would contain extra sets of terms, each set corresponding to a D subscale. This will be discussed further in the following sections, as well as in the section that discusses the derivation of the generalized Weiner-Hopf equation. Optimizing that error measure then entails the concurrent solution of multiple sets of linear equations, with each set associated with a D subscale. An attraction is that each set of linear equations can be of an order that is possibly significantly lower than that of the standard technique. This is due to the reduced number of sample points (or sampling rate) for each D subscale compared to the far higher rate needed by the usual technique.

The most commonly used IIR filter design technique is:

1. Bilinear Transformation

In this general approach, a transfer function is represented as a fraction containing poles and zeros, for the most general IIR case. The generalized D filter transfer function can also be expressed as either a series of such fractions, or combined into one fraction. Then the same standard techniques could be applied.

Several other techniques, less commonly known or used, are available to design filters using both magnitude and phase specifications.

3.2 Nonlinear Filter Design Algorithms

The same enhancements to the standard design techniques apply to the nonlinear systems described in Section 2.4. For this class of nonlinear systems can be characterized by an extension of the sum of sum of tap weight vectors described previously. Therefore the extra vectors in the nonlinear systems are accommodated by simply extending the descriptions in the previous Section 3.1.

3.3 Filters Derived from the Weiner-Hopf Equation

3.3.1 Conventional Weiner-Hopf Equation

The Weiner-Hopf equation underlies the design of adaptive filters as well as of recursive, predictive, Kalman filter types.

It is derived from a linear model that relies on uniformly sampled input and output values, shown in FIG. 21. An equation is derived by seeking the extreme point of a least-mean-square expression to yield, using the nomenclature from "Adaptive Filter Theory" by S. Haykin, $3^{rd}$ edition, $$R\omega = P$$

where:
- $R = E[u(n)u^*(n)]] \rightarrow M \times M$ autocorrelation matrix of input
- $u(n) \rightarrow M \times 1$ tap input vector $[u(n), \ldots u(u-M+1)]^T$
- $\omega = [w_0, \ldots w_{M-1}]^T \rightarrow M \times 1$ vector of transversal filter's tap weight that optimize an error criteria.
- $P = E[u(n)d^*(n)]] \rightarrow M \times 1$ cross correlation matrix of input-output The solution is a vector of possibly complex valued tap weights in the transverse filter. This equation is solved iteratively by descending an M+1 dimensional error performance surface that is shaped as a bowl. It has M degrees of freedom represented by the filter's tap weights. The optimal solution is at the bottom of the bowl, as shown in FIG. 22. At each step:

(Updated value of)=(Last value of)+(Learning rate)*
(Tap input vector) (tap weight) (tap weight) (parameter) (error signal)

This recursively determined solution is realized by dynamically changing tap weights in an adaptive filter.

3.3.2 Generalized Weiner-Hopf Equation for Linear Systems

A generalized Weiner-Hopf equation for linear systems is derived from a mathematical model that uses non-uniformly sampled input and output samples, as well as the D Signal based impulse response, described in Section XXX. The standard Weiner-Hopf equation and model is shown as a special case when uniform sampling is applied. The generalized equation forms the foundation for D filter design.

The generalized Weiner-Hopf equation is derived using the same methodology as that for the standard equation. FIG. 23 presents the model used by the derivation. The derivation relies on the observation that the optimal value of a set of series of terms is located by optimizing each series of terms in the equation. In this case, the set of series occurs because each is associated with one of the D subscales. What results is a set of smaller dimensional conventional Weiner-Hopf equations. The set of such equations can be. organized into a super matrix Weiner-Hopf equation to yield:

| Generalized Weiner-Hopf Equation | |
|---|---|
| $\overline{R}\overline{\omega} = \overline{P}$ | |
| where: | |
| $\overline{R} =$ $E[u_{pi}(n)$ $u_{pj}^*(n)]]$ | $\rightarrow$ Matrix of N × N autocorrelation matrices of D subscale inputs. Each element is an autocorrelation matrix whose elements are correlations between input points on D subscale i and j, for all D subscales. N is the number of subscales in the D Scale. |
| $u_{pi}(n)$ | $\rightarrow$ $M_i \times 1$ tap input vector $[u_{pi}(n) \ldots u_{pi} (u - M_i + 1)]^T$ where each sample is in D subscale i. $M_i$ is the number of samples that depends on The D subscale i. |
| $\overline{\omega} =$ $[W_0, \ldots W_{N-1}]^T$ | $\rightarrow$ Vector of N × 1 vectors $W_i = [W_{i0}, \ldots W_{iMi-1}]^T$ Each vector contains the tap weights for the transversal filter in a D filter bank associated with D subscale i. |
| $\overline{P} =$ $E[u_i(n)$ $d_j^*(n)]]$ | $\rightarrow$ Matrix of N × 1 cross correlation matrices of D subscale input-outputs. Each element is a cross correlation matrix whose elements are correlations between input and output points from D subscales i and j respectively. |
| i and j | $\rightarrow$ $0 <= i, j < N$ where N is the number of D subscales. |

The solution is a vector of vectors of possibly complex valued tap weights in each D filter bank transverse filter. This equation is solved by simultaneously solving each of its standard Weiner-Hopf matrix equation components. Each component is associated with a pair of D subscales, i and j. As with the standard equation, each component equation is solved iteratively by descending an $M_i+1$ dimensional error performance surface that is shaped as a bowl, where $M_i$ is the number of samples in D subscale i. It has $M_i$ degrees of freedom represented by the filter's tap weights. The optimal solution for each equation is at the bottom of each bowl, as shown in FIG. 24. Again, as with the standard case, at each step, for each set of tap weights in the D filter bank:

$$\begin{pmatrix} \text{Updated} \\ \text{value of} \\ \text{tap weight} \end{pmatrix} = \begin{pmatrix} \text{Last value} \\ \text{of tap} \\ \text{weight} \end{pmatrix} + \begin{pmatrix} \text{Learning} \\ \text{rate} \\ \text{parameter} \end{pmatrix} * \begin{pmatrix} \text{Tap input} \\ \text{vector} \\ \text{error signal} \end{pmatrix}$$

This recursively determined solution is realized by dynamically changing tap weights in each adaptive filter in the D filter bank.

3.3.3 Discussion of Generalized Weiner-Hopf Equation

The standard equation results when the special case of uniform sampling is applied. For then, the D Scale has only one subscale and the matrix of vector of vectors collapses to the standard form. Indeed, the underlying model then reverts back from that shown in FIG. 23 to the standard model shown in FIG. 21.

Another point worth noting is that the generalized equation has a structure that is reminiscent of the fractional adaptive equalizer. But even as the syntax describing both systems is similar, the semantics of the two differ considerably. One difference is that the fractional equalizer uses a higher data rate whereas the D Filter is designed around lower rate D Scale signals.

The interpretation of the solution of this equation is a generalization of the interpretation of the usual equation. The search for a solution of this equation can be interpreted as the simultaneous descent down multiple bowls of possibly significant lower dimensions. This is illustrated in FIG. 21. Each extrema of each bowl corresponds to a vector of possibly complex tap weights of a filter in the D filter bank associated with a D subscale. The full solution of the generalized Weiner-Hopf equation then consists of the vector of vectors, one for each of the D subscales.

3.3.4 Generalized Weiner-Hopf Equation for Nonlinear Systems

Nonlinearities of the type described in Section XXX can be readily accommodated by the generalized Weiner-Hopf equation. For the nonlinearities in a channel add additional summations of terms to the impulse response characterization. And these added summations manifest themselves by additional elemental, conventional, Weiner-Hopf equations that must be solved simultaneously. The reasoning is identical to that which yielded the original generalized Weiner-Hopf equation for linear systems, as discussed previously.

The interpretation of the solution for a nonlinear system is of an an additional number of bowls, but each a higher dimension, determined by the extent of the nonlinearities.

3.4 Benefits of Generalized Weiner-Hopf Based Adaptive Filters

The generalized Weiner-Hopf equation underlies the enhanced design of adaptive filters. Its recursive solution is realized by a set of adaptive filters whose tap weights are varied according to the D Scale non-uniformly sampled inputs. Adaptive filters that are based on D filter design have the following advantages over comparable implementations that rely the standard model.

a. Reduced number of taps because each D subscale has far fewer weights than the uniformly sampled case.
b. More sensitive to variations in input signal and able to track the variations and volatility. This falls out of the more accurate characterization of a channel.
c. Non-calculating or pre-wired D Arithmetic to avoid the deleterious effects of round-off errors in real-time filter calculations.
d. Possibly reduced number of iterations for convergence or possibly the time to convergence. This is because the descent down a deep high of order N dimensional bowl is replaced by simultaneous descents down several lower dimensional order and shallow bowls.
e. Readily accommodates certain nonlinearities without linearizing away the problem or approximating it.
f. It enables IIR solutions due to enhanced stability.
g. It enables the use of multiple sets of transversal filters, each with potentially far fewer number of taps than the conventional filter. Fewer taps along the end-to-end path of a sample's traversal is generally advantageous.

3.5 Computing AutoCorrelation and Cross-Correlation

As with the industry standard digital filter, practical implementation of digital filters requires the accurate computation of the input signal's autocorrelation as well as of the cross correlation of the input and output signals. The same D Scale decomposition technique used to derive an exact numeric expression for the Fourier (or other kernel) transform can also provide accurate numeric calculations of autocorrelation and cross-correlation functions of possibly complex valued signals. Further, the derivation is almost identical to that presented previously to compute the convolution.

Consider the continuous autocorrelation integral for an input signal:

$$Ruu(t) = \int_{-\infty}^{+\infty} u(t)u(t+\tau)d\tau$$

Let the underlying D Scale used to sample a signal be comprised of N subscales $\{p_1, \ldots p_N\}$.

Let $\delta_{ij}$ denote the distance of point $p_j$ in D subscale i to the next D Scale point.

Recall that the sampling is uniform at a rate of $1/p_i$ for each subscale i. Therefore, for points on subscale i, $$t=n/p_i$$

where $$n=1,\ldots p_i-1$$

Further, the correlation integral can be decomposed using Riemann summation over the D subscales. The continuous correlation integral is computed by determining its value separately at points on each D subscales.

On each subscale $p_j$, the integration variable τ extends over uniform intervals $1/p_j$. Therefore on each subscale:

$$\tau=k/p_j$$

Also, on each subscale, the non-uniform interval associated with each uniformly distributed D Scale point leads to:

$$d\tau \rightarrow \delta_{j,k}$$

Finally, after substituting these mappings into the Riemann summation that computes the original integral, the following equation emerges:

---
Computation of Autocorrelation using the D Scale $$Ruu(n/p_i) = \sum_{j \in \{p_1,\ldots p_N\}} \sum_{k=0}^{k=p_j-1} u(n/p_i)u(n/p_i + k/p_j)\delta_{j,k}$$

$$0 <= i < N$$
---

Note that, as in the computations of the Fourier transform and convolution, the final result is generated as by concatenating the partial results for each D subscale.

Similarly, consider the continuous cross-correlation integral for input-output signals:

$$Ruy(t) = \int_{-\infty}^{+\infty} u(t)y(t+\tau)d\tau$$

---
Computation of Cross-correlation using the D Scale $$Ruy(n/p_i) = \sum_{j \in \{p_1,\ldots p_N\}} \sum_{k=0}^{k=p_j-1} u(n/p_i)y(n/p_i + k/p_j)\delta_{j,k}$$

$$0 <= i < N$$
---

Note again, that, as in the computations of the Fourier transform and convolution, the final result is generated as by concatenating the partial results for each D subscale.

The autocorrelation functions can also be computed via the indirect approach of computing the spectrum of the signal and relying on the Weiner-Khintchine Theorem. The D Scale based decomposition of the spectrum would then be Applied.

3.6 Generalized Weiner (Matched) Filter

3.6.1 Conventional Weiner Filter

The Weiner filter is also based on the Weiner-Hopf equation although it is typically presented as a matched filter. It relies on a-priori knowledge of to correlate the combined input signal and noise against the expected signal. This why it is often referred to as a matched filter, for it aims to match the input to a specific signal. FIG. 23 shows the standard continuous Weiner filter. FIG. 24 shows the usual discrete realization of the continuous formulation. There, one correlator is applied to uniformly sampled inputs to compute:

$$r_{uy}(l) = 1/N \sum_{n=0}^{N-1} u(n)y(n+1)$$

where 1/N is the sample rate.

3.6.2 Generalized Weiner Filter

The generalized Weiner filter design uses a D Scale data sampler followed by a router to a bank of industry standard Weiner matched filters. The signal to be matched at each Weiner filter in the bank is sampled at the rate of its corresponding D subscale. This is illustrated in FIG. 25.

Note that the design is a subset of the most general D filter design architecture shown in FIG. 6. Note also from that figure, that there are N vectors of weights. Each weight corresponds to a coefficient in the exact autocorrelation expansion of the continuous autocorrelation function of the input signal, however transient or non-stationary.

3.7 Generalized Kalman Filter

The Kalman filter is also based on the Weiner-Hopf equation. But it is most often formulated in the state variable formalism that make the underlying foundation less obvious. The standard Kalman filter is derived from a pair of process (or state) and measurement equations. A signal flow graph representation of a linear discrete-time dynamic system is shown in FIG. 26. That figure illustrates the following equations:

Process (or state) Equation:

$$x(n+1)=F(n+1,n)*x(n)+v_1(n)$$

$x(n) \rightarrow$ Unknown state vector of dimension M at time n unit intervals.

$F(n+1, n) \rightarrow$ Known M×M state transition matrix relating the state of the system at times n+1 and n unit intervals.

$v_1(n) \rightarrow$ M×1 vector representing process noise at time n unit intervals Measurement Equation:

$$y(n)=C(n)*x(n)+v_2(n)$$

$C(n) \rightarrow$ Known N×M measurement matrix.

$v_2(n) \rightarrow$ N×1 vector representing measurement noise at n unit intervals.

$e^-_k = x(n)-x^-(n) \rightarrow$ Estimation error between state vector and prior estimate or best estimate about the process prior to time n.

$P_k = E[e^-_k e^{-T}_k] \rightarrow$ Predicted state error covariance or correlation matrix.

The Kalman filtering problem is to use the entire observed data set, consisting of vectors y(1), y(2), ... y(n), to find for each n≥1, the minimum mean-square estimates of the components of the state x(i).

The generalized Kalman filter is derived using the same analytical steps to derive the standard Kalman filter. The derivation is based on the generalized signal flow graph representation shown in FIG. 27. That figure illustrates the following equations:

Process (or state) Equation:

$$x_j(l)=F_{ij}(l,k)*x_i(k)+v_{li}(k)$$

$x_i(k) \rightarrow$ Unknown state vector of dimension M from D subscale i at time k intervals on that D subscale.

$x_j(l) \rightarrow$ Unknown state vector of dimension M from D subscale j at time l intervals on that D subscale. This is the very next point on the D Scale following $x_i(k)$.

$F_{ij}(l,k) \rightarrow$ Known M×M state transition matrix relating the state of the system at adjacent points on the D Scale, that at l intervals on D subscale j and the previous point at interval k on D subscale k.

$v_{li}(k) \rightarrow$ M×1 vector representing process noise at n unit intervals.

Measurement Equation:

$$y_i(n)=C_i(n)*x_i(n)+v_{2i}(n)$$

$C_i(k) \rightarrow$ Known N×M measurement matrix at a point on the D Scale that is at the k-th interval on D subscale i.

$v_{2i}(k) \rightarrow$ N×1 vector representing measurement noise at a point on the D Scale that is at the k-th interval on D subscale i.

$e^-_{k,i} = x_i(k)-x^-_i(k) \rightarrow$ Estimation error between state vector and prior estimate or best estimate about the process prior to this D Scale point.

$P_k, i = E[e^-_{k,i} e^{-T}_{k,i}] \rightarrow$ Predicted state error covariance or correlation matrix.

The generalized Kalman filtering problem is to use the entire observed data set, consisting of vectors at times on the D Scale $y_i(1), \ldots y_j(1)$, to find for each time along the D Scale (i.e., each partial time series), the minimum mean-square estimates of the components of the state $x_i(k)$ on each D subscale.

The only difference in the analysis is that each new sample is mapped to a D Scale point that is associated with a unique D subscale. The correlation matrix element in the super-matrix of the generalized Weiner-Hopf equation is identified from its D subscale. The correlation matrix element corresponding to that D subscale must be used for that cycle in the Kalman filter's recursive algorithm. Therefore the only addition to the Kalman iterative procedure is to identify which correlation matrix in the super-matrix to use on each iteration.

The resulting modification to the standard Kalman Filter is shown in the flow chart in FIG. 28, with the new steps highlighted. Again, the extra step is to fetch the corresponding correlation matrix element for each new sample point.

Note again that the usual Kalman filter algorithm appears for the special case of uniform sampling. Also note that nonlinearities are transparently factored into the calculations because their effects are already embedded into the off-diagonal weights and their corresponding correlation matrix elements.

The invention claimed is:

1. An extended digital filter apparatus comprising
one or more D scale data multiresolution samplers comprised of multi-resolution uniform data samplers outputting a consolidated, concatenated stream of nonuniformly spaced samples sufficient to satisfy the Nyquist criteria for signal reconstruction;
a filter bank router directing the nonuniformly spaced samples from the D scale multiresolution sampler to a digital filter bank;
said digital filter bank comprising independently operating transversal FIR or IIR digital filters, each adapted to process a uniformly spaced subset of the nonuniform samples;
a sampler controller receiving the nonuniform samples from said filter bank router and providing a second data stream to a phase shifter,
said phase shifter adapted to modify the phase of uniformly spaced sample streams output to a stream consolidator,
said stream consolidator adapted to consolidate the uniformly spaced sample streams into an interleaved digitally filtered stream; and arithmetic tables for mapping measurements or sampled values to D scale points.

2. The extended digital filter apparatus of claim 1, wherein each D scale data multiresolution sampler component independently and concurrently samples the original data at a uniform rate of unique resolution or frequency, to provide multi-resolution sampling.

3. The extended digital filter apparatus of claim 1, wherein the D scale data multiresolution sampler is further comprised of a plurality of A/D converters.

4. The extended digital filter apparatus of claim 3, wherein each A/D converter samples uniformly at a rate determined by each of the D Scale's unique subscale resolution.

5. The extended digital filter apparatus of claim 1, further comprising a dispatcher to fan out an original analog data stream into multiple, replicated, feeds for simultaneous uniform sampling by each of a plurality of subscales.

6. The extended digital filter apparatus of claim 1 wherein said transversal filters of said digital filter bank component implement a vector of tap weights.

7. The extended digital filter apparatus of claim 6 wherein said implementation of a vector of tap weights employs industry standard digital filter architectures.

8. The extended digital filter apparatus of claim 6 wherein each filter component is associated with a particular subscale of the D Scale underlying a nonuniform sampler.

9. The extended digital filter apparatus of claim 6 wherein said the said transversal filters of said digital filter bank are adapted to independently and concurrently process incoming nonuniformly sampled and routed data, at the rate of an associated D Scale's subscaie.

10. The extended digital filter apparatus of claim 1 wherein said filter bank router maps each point in a nonuniform sampler's output stream to its associated transversal filter in said filter bank.

11. The extended digital filter apparatus of claim 1 wherein said stream consolidator concatenates or interleaves uniformly sampled or filtered subscale streams into one nonuniformly spaced stream, both on entry into the digital filter bank, and on completion of filtering by each filter in the bank.

12. The extended digital filter apparatus of claim 1 wherein said components can be flexibly configured, mixed-and-matched and reorganized to enable specialized digital filtering applications.

13. The extended digital filter apparatus of claim 1 wherein said filter is configured based upon the generalized Weiner-Hopf Equation and for which the conventional Weiner-Hopf Equation underlying standard adaptive digital filtering, is a special case.

14. The extended digital filter apparatus of claim 1 wherein said filter is configured based upon the generalized Weiner Filter Equation and for which the conventional Weiner Filter underlying standard matched filtering, is a special case.

15. The extended digital filter apparatus of claim 1 wherein said filter is configured based upon the generalized Kalman Filter Equations and for which the conventional Kalman Filter underlying standard estimation, is a special case.

16. The extended digital filter apparatus of claim 1 wherein said filter is configured to contain an adaptive D Scale sampler, without further filtering.

17. The extended digital filter apparatus of claim 1 wherein said arithmetic tables for mapping measurements are partitioned via networked CPU memory.

18. The extended digital filter apparatus of claim 1 wherein said arithmetic tables implement real time, iterative, filter calculations via lookups to stabilize potential destabilizing round-off errors.

* * * * *